United States Patent
Senda et al.

(10) Patent No.: US 12,308,228 B2
(45) Date of Patent: May 20, 2025

(54) MANUFACTURING METHOD FOR SEMICONDUCTOR SILICON WAFER

(71) Applicant: GLOBALWAFERS JAPAN CO., LTD., Niigata (JP)

(72) Inventors: Takeshi Senda, Niigata (JP); Shingo Narimatsu, Niigata (JP)

(73) Assignee: GLOBALWAFERS JAPAN CO., LTD., Niigata (JP)

( * ) Notice: Subject to any disclaimer, the term of this patent is extended or adjusted under 35 U.S.C. 154(b) by 487 days.

(21) Appl. No.: 17/797,799

(22) PCT Filed: Feb. 16, 2021

(86) PCT No.: PCT/JP2021/005675
§ 371 (c)(1),
(2) Date: Aug. 5, 2022

(87) PCT Pub. No.: WO2021/166896
PCT Pub. Date: Aug. 26, 2021

(65) Prior Publication Data
US 2023/0061427 A1    Mar. 2, 2023

(30) Foreign Application Priority Data
Feb. 19, 2020    (JP) .................................. 2020-026333

(51) Int. Cl.
*H01L 21/02* (2006.01)
*C30B 25/12* (2006.01)
(Continued)

(52) U.S. Cl.
CPC ........ *H01L 21/02381* (2013.01); *C30B 25/12* (2013.01); *C30B 25/186* (2013.01);
(Continued)

(58) Field of Classification Search
CPC ....... C30B 25/12; C30B 25/186; C30B 25/20; C30B 29/06; H01L 21/02002;
(Continued)

(56) References Cited

U.S. PATENT DOCUMENTS 9,425,264 B2    8/2016    Kawashima et al.
9,755,022 B2    9/2017    Kawashima et al.
(Continued)

FOREIGN PATENT DOCUMENTS

JP    2003-286094 A    10/2003
JP    2010205866 A    9/2010
(Continued)

OTHER PUBLICATIONS

International Search Report (PCT/ISA/210) with translation and Written Opinion (PCT/ISA/237) mailed on Apr. 20, 2021, by the Japan Patent Office as the International Searching Authority for International Application No. PCT/JP2021/005675. (11 pages).

(Continued)

*Primary Examiner* — Jose R Diaz
(74) *Attorney, Agent, or Firm* — BUCHANAN INGERSOLL & ROONEY PC

(57) ABSTRACT

The substrate is doped with P, has a resistivity adjusted to 1.05 mΩ·cm or less, and includes defects, formed in the crystal by the aggregation of P, which are Si—P crystal defects substantially. The method includes a step of forming a silicon oxide film on the backside of the substrate with a thickness of 300 nm or more and 700 nm or less, a step of mirror-polishing the substrate, and after the mirror-polishing step, a heat treatment step of the substrate mounted on a substrate holder made of Si or SiC, on the holder surface a silicon oxide film is formed with the thickness between 200 nm and 500 nm, wherein the thickness X of the silicon oxide film of the holder and the thickness Y of that on the backside (Continued)

of the substrate satisfy a relational expression Y=C−X, where C is a constant between 800 and 1000.

7 Claims, 11 Drawing Sheets

(51) Int. Cl.
| | |
|---|---|
| C30B 25/18 | (2006.01) |
| C30B 25/20 | (2006.01) |
| C30B 29/06 | (2006.01) |
| H01L 21/304 | (2006.01) |
| H01L 21/3065 | (2006.01) |
| H01L 21/3205 | (2006.01) |
| H01L 21/322 | (2006.01) |
| H01L 21/324 | (2006.01) |

(52) U.S. Cl.
CPC .............. *C30B 25/20* (2013.01); *C30B 29/06* (2013.01); *H01L 21/02002* (2013.01); *H01L 21/0206* (2013.01); *H01L 21/02164* (2013.01); *H01L 21/02532* (2013.01); *H01L 21/02576* (2013.01); *H01L 21/02658* (2013.01); *H01L 21/304* (2013.01); *H01L 21/3065* (2013.01); *H01L 21/32055* (2013.01); *H01L 21/3221* (2013.01); *H01L 21/3225* (2013.01); *H01L 21/324* (2013.01); *H01L 21/0262* (2013.01)

(58) Field of Classification Search
CPC .......... H01L 21/0201; H01L 21/02016; H01L 21/02381; H01L 21/3221; H01L 21/02576; H01L 21/3225; C08G 77/04; C08G 77/20; C08L 83/04; C08K 5/52; C08K 5/524; C08K 5/14; C09J 183/04
See application file for complete search history.

(56) References Cited

U.S. PATENT DOCUMENTS

| | | | | |
|---|---|---|---|---|
| 10,100,429 | B2* | 10/2018 | Narushima | ............ C30B 15/203 |
| 10,119,193 | B2* | 11/2018 | Hariya | .................... C30B 33/02 |
| 10,253,429 | B2 | 4/2019 | Nonaka et al. | |
| 12,046,469 | B2* | 7/2024 | Senda | ............... H01L 21/02532 |
| 2003/0068502 | A1* | 4/2003 | Togashi | .................. C30B 29/06 |
| | | | | 117/3 |
| 2010/0133485 | A1* | 6/2010 | Kawazoe | ................ C30B 15/04 |
| | | | | 252/500 |
| 2011/0114014 | A1* | 5/2011 | Sakurai | ............... C23C 16/4586 |
| | | | | 117/88 |
| 2011/0140241 | A1* | 6/2011 | Kawazoe | ................ C30B 15/14 |
| | | | | 264/145 |
| 2016/0102418 | A1 | 4/2016 | Narushima et al. | |
| 2018/0087184 | A1 | 3/2018 | Nonaka et al. | |

FOREIGN PATENT DOCUMENTS

| | | | |
|---|---|---|---|
| JP | 2013-030723 | A | 2/2013 |
| JP | 2013-048137 | A | 3/2013 |
| JP | 5845143 | B2 | 11/2015 |
| JP | 2016213232 | A | 12/2016 |
| JP | 2017088460 | A | 5/2017 |
| JP | 6477210 | B2 | 2/2019 |
| JP | 2019142733 | A | 8/2019 |
| JP | 2019186449 | A | 10/2019 |
| WO | 2014175120 | A1 | 10/2014 |

OTHER PUBLICATIONS

Senda et al., "Atomic Structures of Grown-in Si—P Precipitates in Red-Phosphorus Heavily Doped CZ-Si Crystals", (TuP-16), 29th International Conference on Defects in Semiconductors, (Aug. 1, 2017),(3 pages).

Senda et al., "Atomic Structures of Grown-in Si—P Precipitates in Red-Phosphorus Heavily Doped CZ-Si Crystals", (7p-PB6-5), The 78th JSAP Autumn Meeting, (Sep. 5-8, 2017), with an English abstract. (3 pages).

Office Action (The First Office Action) issued Apr. 5, 2023, by the State Intellectual Property Office of People's Republic of China in corresponding Chinese Patent Application No. 202180015640.8. (5 pages).

* cited by examiner

MANUFACTURING METHOD FOR SEMICONDUCTOR SILICON WAFER

The present invention relates to a method for manufacturing semiconductor silicon wafers, specifically relates to a method for manufacturing a semiconductor silicon wafer composed of a silicon wafer substrate and a silicon monocrystalline epitaxial layer to be formed thereon, where the silicon wafer substrate is doped with phosphorus P and has a resistivity of 1.05 mΩ·cm or less.

BACKGROUND ART

The substrate resistivity of the most advanced epitaxial wafer for power metal oxide semiconductor field-effect transistor (MOS-FET) devices is 1.00 mΩ·cm or less. To further reduce the resistivity of the substrate requires an increase in dopant concentration. Therefore, the n-type dopant species has shifted from arsenic and antimony to phosphorus (P), which has relatively low volatility, and its concentration is approximately $1 \times 10^{20}$ atoms/cm$^3$.

As recited in patent literature PTL 1 to PTL 2, growing an epitaxial layer with the increased dopant concentration causes to generate stacking faults (hereinafter also referred to as SF) in the epitaxial layer. In particular, SF are apt to occur in the case of substrates having a resistivity of 1.1 mΩ·cm or less.

It is reported in PTL 1 to PTL 3 that the reason is speculated that the crystal defects originating from the SF are defects due to clusters of phosphorus (P) and oxygen (O). Further, PTLs also report the inhibition technologies of crystal defects in the process of heat treatment and epitaxial growth.

Specifically, clusters of phosphorus and oxygen (micro precipitates) are formed in a silicon wafer heavily doped with phosphorus. Then, to remove the natural oxide layer on the surface of the silicon wafer, by performing heat treatment in a hydrogen gas atmosphere (hereinafter referred to as hydrogen baking processing), the clusters are selectively etched to become into fine pits, due to the etching action of hydrogen and the difference in etching speed between the outermost surface of the silicon wafer and the clusters. The PTLs report that it is speculated that when an epitaxial layer is grown on a silicon wafer in which the micro pits are formed, SF originating from the micro pits are generated in the epitaxial layer.

Patent Literature PTL 1 discloses a method for manufacturing an epitaxial silicon wafer including

- a step of forming an oxide film on the back surface of a silicon wafer cut out from a single crystal ingot manufactured by the CZ method,
- a step of removing the oxide film existing on the outer circumference of the silicon wafer,
- a step of argon annealing in which the silicon wafer after the removal of the back-surface oxide is heat-treated at a temperature of 1200° C. or higher and 1220° C. or lower in an argon atmosphere,
- a step of the hydrogen baking process in which the wafer after the argon annealing step is heat-treated for 30 seconds or more and 300 seconds or less at a temperature of 105° C. or more and 1200° C. or less in a hydrogen atmosphere, and
- a step of growing an epitaxial layer on the surface of the silicon wafer after the hydrogen baking process.

The document PTL1 also recites that SF (SF) in the epitaxial layer can be inhibited by the above process steps.

PTL 2 also recites, similar to PTL 1, a method for manufacturing an epitaxial silicon wafer that inhibits the occurrence of SF in the epitaxial layer.

The heat treatment described in PTL 1 and PTL 2 is generally carried out, in consideration of productivity, in which a plurality of substrates is mounted on the substrate holder and processed at a time, a batch process.

CITATION LIST

Patent Literature

PTL 1: Japanese Patent No. 5845143
PTL 2: Japanese Patent No. 6477210

SUMMARY OF INVENTION

Technical Problem

Studies of the present inventors clarify that the countermeasures described in PTL1 and 2 are not sufficient to reduce SF.

In their experiments, monocrystalline silicon wafers doped with phosphorus and having a resistivity of 0.8 mΩ·cm and oxygen concentration of $0.8 \times 10^{18}$/cm$^3$ grown by the Chzochralski method are heat-treated in an argon atmosphere at 1200° C. for one hour.

Successively, after hydrogen baking at 1180° C. for 60 seconds in a hydrogen gas atmosphere, an epitaxial layer with a thickness of 3 μm was grown on the wafer surface. Then the number of LPDs of not less than 90 nm in size is evaluated with SP-1 manufactured by KLA-Tencor Corporation operated in DCN mode. It is observed that the density of LPDs originating from SF is at least not less than 10/cm$^2$, this means not less than 3,140 per wafer.

As is shown above, it is difficult to inhibit the formation of SF even though the concentration of the solid-solution oxygen in the surface layer is sufficiently reduced by the heat treatment under the argon gas atmosphere.

The present inventors have intensively studied the inhibition of SF in an epitaxial layer. As a result, they found that the cause of SF in the epitaxial layer is P-aggregation defects, that is, Si—P defects formed of phosphorus and silicon.

Further, they found that P-aggregation defects (Si—P defects) have an internal extra Si plane (SF) therein, and this becomes crystal strain on the substrate surface that is before deposition of the epitaxial layer and forms SF propagating the epitaxial layer (epi-layer) in the growth of the epitaxial layer thereafter.

The Si—P defects, as shown in References 4 and 5, are plate-like defects containing silicon and a few atomic percent of phosphorus. Phosphorus atoms reside not at the atomic site but interstitially, and surplus silicon atoms (extrinsic SF) are also contained.

The phosphorus concentration estimated from the resistivity around the defects is approximately 0.2 atom %, the phosphorus aggregates locally, and the epitaxial layer contains crystal strains.

The inventors have also found it difficult to inhibit. SF caused by P aggregation defects (Si—P defects) by the techniques described in PTLs 1 and 2, and that it is necessary to optimize all the processes such as heat treatment, epitaxial layer growth, and thereby have completed the present invention.

The non-patent references NPL 1 to NPL 2 are as follows:

NPL 1: "Atomic structures of grown-in Si—P defects in red-phosphorus heavily doped CZ Si crystals" (TuP-16), 29th International Conference on Defects in Semiconductors.

NPL 2: "Atomic structures of grown-in Si—P defects in red-phosphorus heavily doped CZ—Si crystals" [7p-PB6-5], The 78th JSAP Autumn Meeting.

Furthermore, the inventors have intensively studied the technical issue that the out-diffusion of phosphorus (P) as a dopant from the phosphorus (P)-doped substrate during processes such as heat treatment and epitaxial layer growth for suppressing SF originating from P-aggregation defects (Si—P defects) causes variations in resistivity of the epitaxial layer (epi-layer) and the device active layer formed therein.

A silicon oxide film is typically formed on the backside of the silicon wafer in a power metal-oxide field-effect transistors (power MOSFET) case. The silicon oxide film formed on the backside of the wafer is for inhibiting auto-doping at the time of epitaxial layer deposition.

Meanwhile, the silicon oxide film is etched by the in-furnace gas during the heat treatment. There may be a risk of ultra-thinning of the silicon oxide film thickness by the direct reduction by the substrate holder material at the holding position of the substrate or risk of exposure of the substrate surface.

As a result, there is a risk of causing variation in resistivity in the epitaxial layer (epi-layer) or the active layer of devices to be built therein due to the out-diffusion of phosphorus (P) as a dopant from the substrate heavily doped with phosphorus.

The intensive study leads the inventors to make an invention with the knowledge acquired that the out-diffusion of phosphorus (dopant) from the P-doped substrate and the variation in resistivity in the epitaxial layer (epi-layer) or the active layer in the devices to be built in the epitaxial layer are suppressed if there exists a particular relationship between the thickness of the silicon oxide film formed on the backside of the wafer and that of the silicon oxide film formed on the substrate holder in the processes such as heat treatment and epitaxial layer growth to suppress SF originating from P-aggregation defects (Si—P defects).

The present invention is made in consideration of such circumstances and aims at providing a manufacturing method for silicon wafers that is capable of suppressing the generation of P-aggregation defects (Si—P defects), the occurrence of SF in the epitaxial layers, and the variation in resistivity.

Solution to Problems

The method for manufacturing semiconductor silicon wafers according to the present invention made to achieve the above purpose includes a step of forming a silicon oxide film having a thickness of 300 nm or more and less than 700 nm on a back surface of a silicon wafer substrate, the silicon wafer substrate being manufactured from a Si single crystal ingot grown by the Czochralski method, the silicon wafer substrate having a dopant of phosphorus (P), the resistivity adjusted to 1.05 mΩ·cm or less, and containing defects formed by the aggregation of P in the crystal being essentially a Si—P crystal defect;

a step of mirror polishing the silicon wafer substrate; after the polishing step, a step of heat treatment to keep the silicon wafer substrate mounted on a substrate holder at a constant temperature of 700° C. or higher and 850° C. or lower for 30 minutes or longer and 120 minutes or shorter at a processing gas flow speed of 0.1 m/s or higher and 1.0 m/s or lower at a distance within 5 mm from the silicon wafer substrate, and then after raising the temperature, at a constant temperature of 1100° C. or higher and 1250° C. or lower for 30 minutes or longer and 120 minutes or shorter with the flow speed of processing gas maintained, and the substrate holder which is made of silicon (Si) or silicon carbide (SiC), has a silicon oxide film on the surface with a thickness of 200 nm or more and 500 nm or less and satisfies a relational equation Y=C−X, where X denotes the thickness of the silicon oxide film of the substrate holder and Y denotes the thickness of the silicon oxide film formed on the backside of the silicon wafer substrate, and C denotes a constant with a value from 800 to 1000.

Thus, the manufacturing method for silicon wafers according to the present invention allows to inhibit the formation of SF in the epitaxial layer because the formation of P-aggregation defects (Si—P defects) is inhibited in the heat treatment step. Specifically, the silicon wafer substrates to be used in the present invention are those doped with phosphorus and adjusted to have the resistivity of 1.05 mΩ·cm or less and include defects formed by the aggregation of phosphorus in the crystal that are essentially Si—P crystal defects.

It is desirable that the maximum side length of the Si—P crystal defects is less than 100 nm and the density thereof is less than $10^{12}/cm^3$. When the maximum side length is 100 nm or longer, Si—P defects become revealed as SF (Light point defect; LPD) after the epitaxial layer forming process. Further, it is not desirable because when the density of Si—P defects is not less than $1 \times 10^{12}/cm^3$, the number of SF remarkably increases.

Further, the out-diffusion of phosphorus as a dopant from the silicon wafer substrate is inhibited and the variation in resistivity in the epitaxial layer (epi-layer) and that in the devices active layer formed therein are inhibited because a silicon oxide film with a thickness of 300 nm or more and not more than 700 nm is formed on the backside of the silicon wafer substrate and the silicon wafer substrate is heat-treated mounted on the substrate holder on which a silicon oxide film having a particular thickness is formed.

While keeping the flow speed of the process gas within a distance of 5 mm from the silicon wafer substrate to be not less than 0.1 m/s and not more than 1 m/s, the silicon wafer substrate is kept at a constant temperature of not less than 700° C. and not more than 850° C. for not less than 30 minutes and not more than 120 minutes.

When thermally processed at a temperature of 700° C. or higher, impurities, moisture, and oxygen desorb from the silicon oxide film formed on the backside of the wafers. In contrast, the surface of the silicon wafer substrates becomes apt to react when thermally processed at a temperature of 850° C. or higher. Therefore, when thermally processed at a temperature of 850° C. or higher, the surface roughness of the wafer deteriorates by the impurities desorbed from the silicon oxide film.

In the present invention, deterioration of the surface roughness by the impurities desorbed from the silicon oxide film is inhibited by keeping the wafer at a constant temperature of not less than 700° C. and not more than 850° C. Further, since the growth temperature of phosphorus-aggregation defects (Si—P defects) is less than 700° C., and the temperature to extinguish the defects is not less than 700° C., keeping the wafer at a constant temperature of not less than 700° C. and not more than 850° C. allows reducing the phosphorus-aggregation defects (Si—P defects). The keeping time of the silicon wafer substrate at the temperature range is for not less than 30 minutes and not more than 120 minutes.

The keeping time shorter than 30 minutes is not desirable because the densification of the silicon oxide film is not sufficient and P-aggregation defects (Si—P defects) cannot be eliminated, and the keeping time longer than 120 minutes is not desirable because the productivity decreases.

The flow speed of the process gas at a distance of within 5 mm from the silicon wafer substrate is set to not less than 0.1 m/s and not more than 1.0 m/s because the etching of the oxide film on the backside of the silicon wafer substrate is taken into account.

It is not desirable because when the flow speed of the process gas is less than 0.1 m/s, the gas flow in the furnace is not rectified and it becomes a cause of contamination, and it is not desirable because when the flow speed thereof is more than 1.0 m/s, the etching of the oxide film on the backside of the silicon wafer substrate is promoted. The phrase "at a distance within 5 mm from the silicon wafer substrate" means that the distance from the backside of the silicon wafer substrate is within 5 mm, and the reason for setting the distance to within 5 mm is that the distance determines the amount of etching of the oxide film on the backside of the silicon wafer substrate.

After the silicon wafer substrate is kept at a constant temperature of not less than 700° C. and not more than 850° C. for not less than 30 minutes and not more than 120 minutes, and further, the temperature is raised with maintaining the flow speed of the process gas and the silicon wafer substrate is kept at a constant temperature of not less than 1100° C. and not more than 1250° C. for not less than 30 minutes and not more than 120 minutes.

Thus, keeping the silicon wafer substrate at a constant temperature of not less than 1100° C. and not more than 1250° C. for not less than 30 minutes and not more than 120 minutes is for the relaxation of strains due to Si—P defects, and the relaxation of the strain due to Si—P defects allows inhibiting P-aggregation defects (Si—P defects).

After that, the temperature of the silicon wafer substrate is lowered, and the experience time of the wafers at a temperature of 700° C. or lower and 450° C. or higher is preferably made less than 10 minutes. Thus, shortening the transit time through the temperature range of 700° C. to 450° C. allows for inhibiting P-aggregation defects (Si—P defects).

The process gas in the heat treatment is a mixture gas of hydrogen ($H_2$) and argon (Ar).

Since the heat treatment of silicon wafers is carried out using the mixture gas of hydrogen ($H_2$) and argon (Ar) as above, when the hydrogen partial pressure is 80% to 50% and the temperature is less than 850° C., impurities such as moisture in the oxide film are reduced. As a result, densification is promoted. Further, when the hydrogen partial pressure is 0.01% to 20% and the temperature is 850° C. or higher, the reduction of silicon dioxide film ($SiO_2$) by hydrogen ($H_2$) is preferably suppressed and the decrease in thickness is preferably inhibited.

After the heat treatment step, the oxide film on the backside of the silicon wafer substrate is removed by a distance of 0.1 mm to 1.0 mm from the periphery by machining. The phrase "distance of 0.1 mm to 1.0 mm from the periphery" means the distance inward from the silicon wafer substrate periphery ranging from 0.1 mm to 1.0 mm.

The reason why the oxide film on the backside of the silicon wafer substrate is removed by grinding to a particular distance ranging from 0.1 mm to 1.0 mm from the periphery is that the removed portion is the position from where phosphorus out diffuses during the long-time processing of the heat treatment thereafter, and hence, out-diffusion of phosphorus during the epitaxial layer forming process from the position is inhibited, which is a countermeasure for auto-doping. Note that the removed area is very small, and the amount of inward diffusion into the wafer is negligible after prolonged heat treatment.

Further, it is not desirable that the above effect is not obtainable when the removal length of the silicon oxide film is less than 0.1 mm, and when, in contrast, the removal of the silicon oxide film is more than 1.0 mm, mechanical damage by the substrate holder in the prolonged heat treatment and the epitaxial layer forming process increases caused by the increase of the area without the oxide film.

After the heat treatment, further, a silicon monocrystalline epitaxial layer having a thickness of 1.3 μm or more to 10 μm or less is deposited. When the thickness of the silicon monocrystalline epitaxial layer is less than 1.3 μm, the control of electrical properties in device operation is difficult. When the thickness exceeds 10 μm, it is not desirable from the viewpoint of cost for production.

As described above, according to the present invention, SF in the epitaxial layer can be finally inhibited by inhibiting the phosphorus-aggregation defects (Si—P defects) in the heat treatment step. As described above, according to the present invention, further, the out-diffusion from the silicon wafer substrate of phosphorus as a dopant is inhibited, and the resistivity variation in the epitaxial layer (epi-layer) and that in the active layer in the devices to be formed therein can be suppressed.

The substrate holder has a holding surface to hold the silicon wafer substrate, and it is preferable to set the angle between the perpendicular line to the holding surface and the perpendicular line to the silicon wafer substrate surface to be held to 0.5 degrees or more and 5.0 degrees or less.

When the angle between the perpendicular line to the holding surface and the perpendicular line to the silicon wafer substrate surface is less than 0.5 degrees, the thicknesses of oxide films on both the backside of the wafer and the substrate holder significantly decrease due to the increase in the contacting area therebetween, which is not preferable.

On the other hand, when the angle between the perpendicular line to the holding surface and the perpendicular line to the surface of the held silicon wafer substrate is more than 0.5 degrees, the holding position becomes the beveled portion of the wafer and the beveled portion is easily damaged, which is not preferable.

It is preferable that the substrate holder holds a plurality of silicon wafer substrates and the spacing between silicon wafer substrates is 10 mm or more and 15 mm or less. It is not preferable that the spacing between the silicon wafer substrates is less than 10 mm because the surfaces of opposing wafers are continuously oxidized and etched in the vapor phase by the decomposed oxide film, thereby being the cause of increasing the surface roughness. The spacing between the silicon wafer substrates of more than 15 mm is not preferable because the productivity reduces due to the decrease in the number of wafers processed.

The silicon oxide film on the surface of the substrate holder is preferably formed using two source gases of oxygen and nitrogen at a temperature of 1000° C. or higher. The reason why the two source gases of oxygen and nitrogen are used is that the film to be formed is an oxynitride and this allows inhibiting the decomposition of the silicon oxide film by a chemical reaction.

It is desirable that the process gas for heat treatment at a temperature range of 700° C. or higher to less than 850° C. is a diluted argon gas with hydrogen whose partial pressure is in a range of 50% to 80% and the process gas at a higher temperature of 850° C. or more is a diluted argon gas with hydrogen whose partial pressure is in a range of 0.01% to 20%.

The reason why the process gas for heat treatment at a temperature range of 700° C. or higher to less than 850° C. is a diluted argon gas with hydrogen whose partial pressure is in a range of 50% to 80% is that the densification of the silicon oxide film is promoted because impurities such as moisture in the oxide film are reduced at a temperature of less than 850° C. in a diluted argon gas with hydrogen whose partial pressure is in a range of 50% to 80%. Further, the reason why the process gas at a temperature of less than 700° C. and 850° C. or more is a diluted argon gas with hydrogen whose partial pressure is in a range of 0.01% to 20% is to inhibit the reduction of the oxide film ($SiO_2$) by hydrogen ($H_2$).

To silicon wafer substrates before a step of forming an epitaxial layer, a surface cleaning step is performed, in which step the surface silicon is desirably removed to a depth of 50 nm or more and 150 nm or less by etching with a mixed gas of hydrogen ($H_2$), hydrogen chloride (HCl), and Si—H—Cl gas.

Thus, by performing the cleaning step, SF after the epitaxial layer growth can be further decreased.

In this case, defect removal by hydrogen chloride HCl is effective, and defect removal by mixed gas of hydrogen $H_2$ and hydrogen chloride HCl is further desirable.

However, the remaining depth of defects is approximately 100 nm or less, and the etching of surface silicon to a depth of 50 nm or more to 150 nm or less is appropriate when productivity is taken into account.

Deposition of silicon is preferably performed at a temperature of 1100° C. or higher and 1150° C. or lower at a deposition rate of 3.5 µm/min or faster and 6.0 µm/min or slower.

It is found that LPD is inhibited by setting the temperature to 1100° C. or higher and 1150° C. or lower and the deposition rate to 3.5 µm/min or faster and 6.0 µm/min or slower.

The reason why the silicon monocrystalline epitaxial layer is deposited with a thickness of 1.3 µm or more and 10 µm or less is as follows: it is not desirable because the silicon monocrystalline epitaxial layer deposited with a thickness of less than 1.3 µm cannot bear the electric voltage applied during the device process, and the film with a thickness of more than 10.0 µm increases the cost of epitaxial wafers.

Advantageous Effect of the Invention

According to the present invention, a manufacturing method of semiconductor silicon wafers is provided by which P-aggregation defects (P—Si defects) are inhibited, SF in the epitaxial layer are inhibited, and further resistivity variation is inhibited.

DESCRIPTION OF EMBODIMENTS

Embodiments of the method for manufacturing silicon wafers according to the present invention will be described in detail with reference to FIGS. 1 through 3. The embodiments shown below are examples and the invention is not limited to the embodiments.

Figure 1:
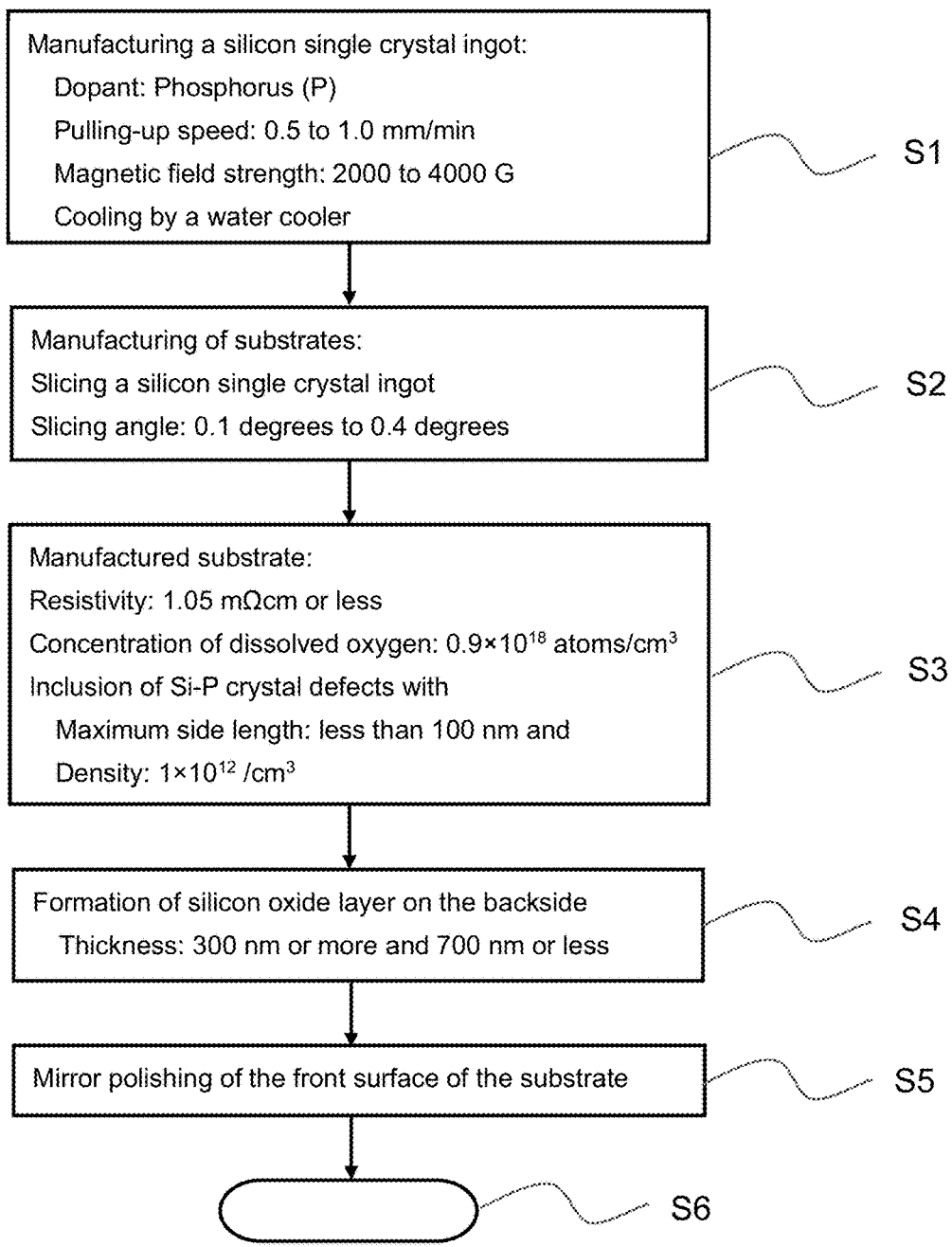
FIG. 1 is a flowchart of an embodiment of a manufacturing method for silicon wafers according to the present invention.

As shown in FIG. 1, silicon single crystal is grown by the Czochralski (CZ) method to manufacture a silicon single crystal ingot (Step S1). In this step a silicon single crystal doped with phosphorus (P) is pulled up at a pulling-up speed of 0.5 mm/min or faster and 1.0 mm/min or slower under an applied magnetic field of 2000 G or higher and 4000 G or lower.

The reason why the pulling-up speed is set in the range of 0.5 mm/min to 1.0 mm/min is that it is necessary to set the ratio G/V to be large to suppress the occurrence of the constitutional undercooling phenomenon that crystals grow in a cellular form in a low resistivity region, where G is the temperature slope of the melt and V is the pulling-up speed.

That is, the constitutional undercooling phenomenon can be suppressed by reducing the pulling-up speed V. With the pulling-up speed reduced, the generation of P-aggregation defects (Si—P defects) cannot be inhibited because the transit time increases at a temperature of 700° C. or lower, that is, in a temperature range of 600° C. to 700° C.

For this reason, by installing a water-cooler in the pulling furnace to forcibly cool the crystals, setting the pulling speed to 0.5 or more and 1.0 mm/min or less, and applying a magnetic field at 2000 or more and 4000 Gauss, the temperature gradient G is increased, the constitutional undercooling phenomenon is suppressed, and P aggregation defects (Si—P defects) are suppressed. This manufacturing condition is the condition for shortening the transit time, because in crystal growth, the temperature range between 600° C. and 700° C. is the temperature range that promotes the growth of Si—P defects.

Specifically, it is not desirable because P-aggregation defects (Si—P defects) cannot be inhibited with a pulling-up speed of less than 0.5 mm/min, and the constitutional undercooling phenomenon cannot be suppressed with a pulling-up speed exceeding 1.0 mm/min.

Figure 9:
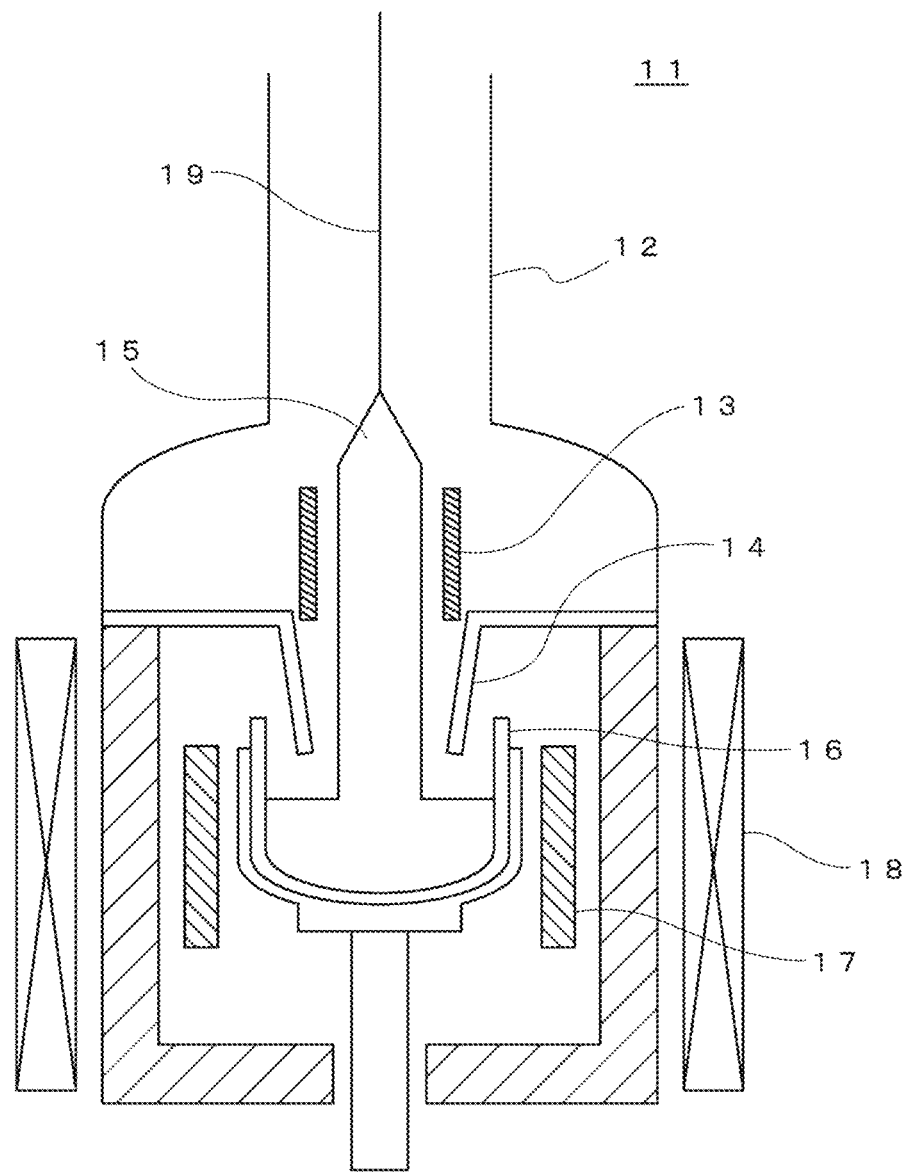
FIG. 9 is an overview structural diagram of a pulling-up apparatus provided with a water cooler.

The grown crystal is forcibly cooled by the water cooler equipped in the pulling-up furnace. As shown in FIG. 9, for example, the silicon single crystal 15 being grown is forcibly cooled using the water cooler disposed in a space between the upper area of the pulling-up furnace 2 and the radiation shield 4 in the pulling-up apparatus 11, and this allows the transit time in a temperature range of 600° C. or higher to 700° C. or lower to be shortened. In FIG. 9, the referential number 16 denotes the quartz glass crucible, the number 17 denotes the heater, the number 18 denotes the magnetic field application unit, and the number 19 is the wire for pulling up a silicon single crystal 15.

Figure 4:
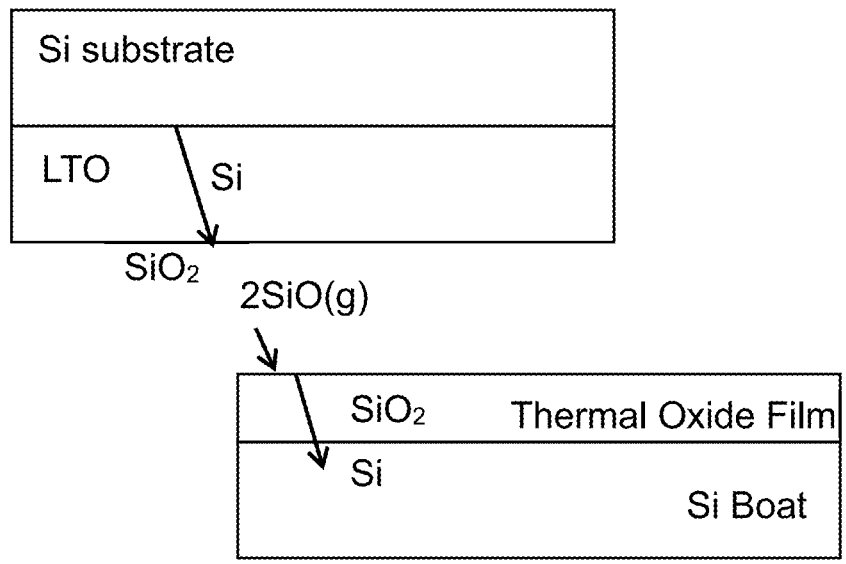
FIG. 4 is a schematic drawing illustrating the chemical reaction between the silicon oxide film formed on the backside of the silicon wafer substrate and the silicon oxide film formed on the substrate holder.

Thus, the grown silicon single crystal is forcibly cooled to a temperature of less than 600° C. As shown in FIG. 4, P-aggregation defects (Si—P defects) are inhibited by shortening the experience time of the wafers in a temperature range of 600° C. or higher to 700° C. or lower.

Silicon wafer substrates are prepared by slicing a silicon single crystal ingot at a slicing angle in a range of 0.1 degrees to 0.4 degrees against the principal surface orientation (Step S2).

The slicing angle of the silicon wafer substrates affects the growth and elimination of SF at the time of deposition of the epitaxial layer. The principal surface orientation is Si(100) and the slicing angle ranges 0.1 degrees to 0.4 degrees.

A silicon step terrace that would be a path for the movement of silicon atoms during epitaxial layer formation for the elimination of stacking fault defects is formed by setting the slicing angle to be in a range of 0.1 degrees to 0.4 degrees against the principal surface orientation. Due to the formation of the silicon step terrace, silicon atoms can move along the terrace. The movement allows the removal of the strains of the silicon atoms and the elimination of the SF.

Thus manufactured silicon wafer substrates have a resistivity of 1.05 mΩ·cm or less and the solid-solution oxygen concentration of $0.9 \times 10^{18}$ atoms/cm$^3$ or less and contain Si—P defects that are essentially defects formed by aggregation of phosphorus in the crystal (Step S3).

Silicon wafer substrates demanded in the technical field have a resistivity of 1.05 mΩ·cm or less, the solid-solution oxygen concentration of $0.9 \times 10^{18}$ atoms/cm$^3$ or less. Si—P crystal defects are inhibited by the above-described method of silicon wafer substrates (Steps S1 and S2), but Si—P crystal defects still remain; the silicon wafer substrates contain Si—P crystal defects. The above values of the resistivity and the solid-solution oxygen concentration can be achieved by adjusting the dopant concentration, pulling-up speed, and magnetic field intensity.

The dopant concentration, pulling-up speed, and magnetic field intensity may be varied to obtain the predetermined resistivity and predetermined solid-solution oxygen concentration.

The Si—P defects of thus prepared silicon wafer substrates desirably have less than 100 nm in side length and the concentration of the defects less than $1 \times 10^{12}$/cm$^3$.

When the maximum side length of the Si—P defects is 100 nm or more, Si—P defects reveal as SF (LPD) after the formation of the epitaxial layer. When the density of the Si—P defects is $1 \times 10^{12}$/cm$^3$ or more, SF (LPD) also remains.

Therefore, it is desirable that the maximum side length of the Si—P defects is less than 100 nm, the density of the Si—P defects is less than $1 \times 10^{12}$/cm$^3$, and the crystal growth so adjusted is desirably performed.

Next, a silicon oxide film is formed on the back surface of the silicon wafer substrate (Step S4). For power MOSFET devices, a silicon oxide film is generally formed on the back surface of the wafer, and the silicon oxide film is formed by low-temperature CVD at a temperature less than 500° C., for example.

The back surface oxide film is for preventing auto-doping when the epitaxial layer is grown. The oxide film is typically formed to a thickness of 300 nm to 700 nm at a reduced pressure atmosphere at a temperature range of 400° C. to 500° C.

Further, the thickness of the silicon oxide film of the substrate holder that will be described later, denoted by X, and the thickness of the silicon oxide film formed on the backside of the silicon wafer substrate, denoted by Y, satisfy a relational expression Y=C–X, where C denotes a constant with a value of 800 to 1000.

Since the thickness of the silicon oxide film of the substrate holder that will be described later, denoted by X, and the thickness of the silicon oxide film formed on the backside of the silicon wafer substrate, denoted by Y, fall in a particular range as specified above, the out-diffusion of phosphorus P as a dopant from the silicon wafer substrate can be inhibited and the variation in resistivity of the epitaxial layer (epi-layer) and that of the active layer of the devices formed therein can be suppressed when the silicon wafer substrate mounted on the substrate holder is subjected to heat treatment.

If specifically described, as shown in FIG. 4, silicon dioxide SiO$_2$ desorbs from the silicon oxide film (low-temperature oxide; LTO) formed on the backside of the silicon wafer substrate:

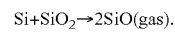

The desorbed SiO (gas) oxidizes the silicon oxide film (thermal oxide film) on the substrate holder, Si boat, made of silicon or silicon carbide on which surface silicon oxide film is formed, and silicon Si is released:

SiO (gas) desorbs also from the silicon oxide film (thermal oxide film) of the substrate holder, Si boat, but it is negligible since the amount is 1/100 of the amount from the silicon oxide (LTO) formed on the backside of the silicon wafer substrate.

Thus, if the silicon oxide film (thermal oxide film) on the substrate holder is oxidized, it is difficult to constantly hold, mount, the silicon wafer substrate in the same condition.

Therefore, it necessary to specify the thickness of oxide film of both the silicon oxide film formed on the backside of the silicon wafer substrate and the silicon oxide film (thermal oxide film) of the substrate holder.

First, to prevent in-film diffusion of silicon and then out-diffusion of dopant thereafter, the thickness of the silicon oxide film (LTO) formed on the backside of the silicon wafer substrate should be 300 nm or more and 700 nm or less, and the thickness of the silicon oxide film (thermal oxide film) on the substrate holder, Si boat, should be 200 nm or more and 500 nm or less.

When the film thickness of the Si oxide film formed on the back surface of the silicon wafer substrate is less than 300 nm, auto-doping from the silicon wafer substrate becomes remarkable due to phosphorus passing through the oxide film, which is not desirable. If it exceeds 700 nm, it is not preferable because it reduces productivity and increases cost.

Further, it is not preferable that the thickness of the silicon oxide film (thermal oxide film) on the substrate holder is less than 200 nm because the decrease of the oxide film on the backside of the silicon wafer substrate becomes remarkable, and it is not preferable that the thickness exceeds 500 nm because of the productivity decrease and rise in cost.

The thickness variation of the silicon oxide film (thermal oxide film) of the substrate holder reduces when the increase in thickness of the silicon oxide film (thermal oxide film) of the substrate holder due to the supply of SiO (gas) from the silicon oxide film formed on the backside of the silicon wafer substrate comes to equal to the decrease in thickness of silicon oxide film (thermal oxide film) of the substrate holder due to oxidation. Exceedingly thickening may cause an increase in cost.

Figure 5:
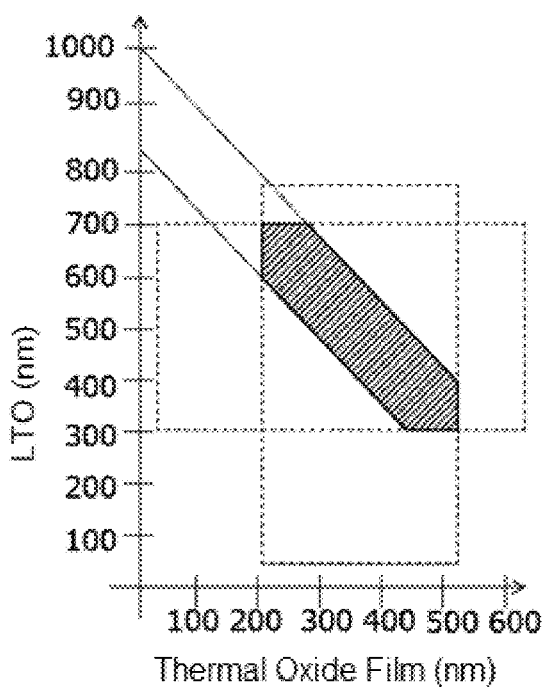
FIG. 5 shows the relation between the thicknesses of the silicon oxide film formed on the backside of the silicon wafer substrate and the thickness of the silicon oxide film formed on the substrate holder.

As shown in FIG. 4, $SiO_2$ desorbs from the silicon oxide film (LTO) formed on the backside of the silicon wafer substrate, the desorbed SiO diffuse in the thermal oxide film, oxidize, and release Si atoms. Because when the thermal oxide film on the substrate holder is oxidized, it is difficult to constantly hold, mount, the silicon wafer substrate in the same condition, the thickness of LTO and the thermal oxide film on the substrate holder should be considered. Since the in-diffusion speeds in the LTO and the thermal oxide film on the substrate holder depend on their thickness, the balance in thickness variation of both films can be maintained by keeping one being thicker and the other being thinner. FIG. 5 shows this situation and the shaded area is the appropriate range.

The front surface of the silicon wafer substrate is subjected to mirror polishing processing after the formation of silicon oxide film on the backside of the silicon wafer substrate (Step S5).

Mirror polishing is generally performed by the mechanical effect of a polishing cloth and the chemical effect of a slurry. The mirror polishing process does not directly reduce Si—P defects. By reducing the surface roughness, however, Si—P defects are ready for being eliminated in the subsequent heat treatment.

Figure 2:
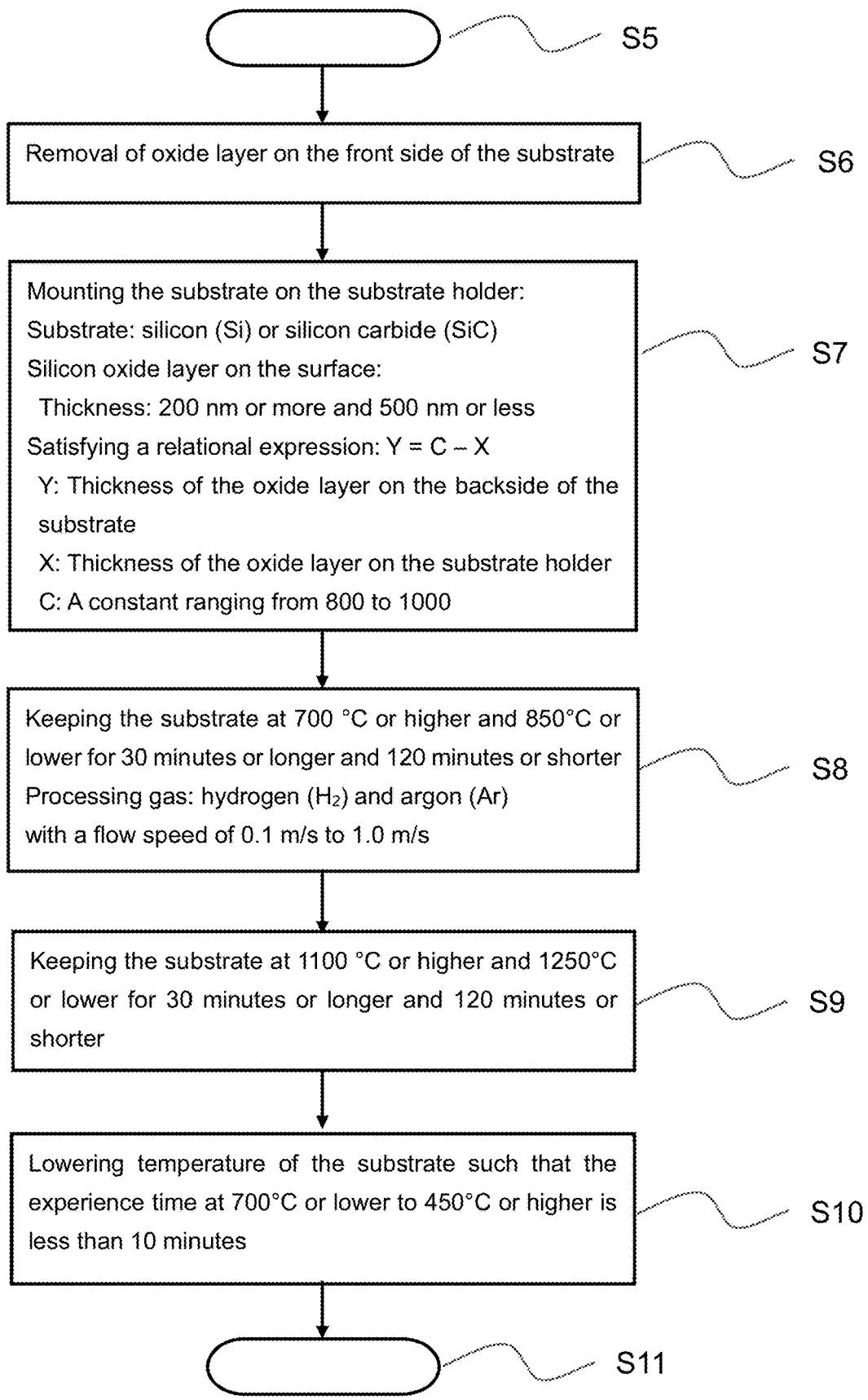
FIG. 2 is the continuation of the flowchart in FIG. 1 of the embodiment of the manufacturing method for silicon wafers according to the present invention.

The oxide film on the front side of the mirror-polished surface is removed with an acid solution or in an acidic atmosphere, as shown in FIG. 2 (Step S6).

For annihilation of Si—P defects, because it is necessary to remove the natural oxide film on the front surface of the silicon wafer substrate as well as to clean the silicon surface, a process of oxide film removal is desirably included. As an example of the oxide film removal with a chemical solution, the process preferably uses hydrofluoric acid diluted with pure water having the concentration of 0.1% to 5% for 30 s to 120 s.

Then, the silicon wafer substrate having a silicon oxide film on the surface is mounted on the substrate holder made of silicon or silicon carbide (Step S7).

Figure 6:
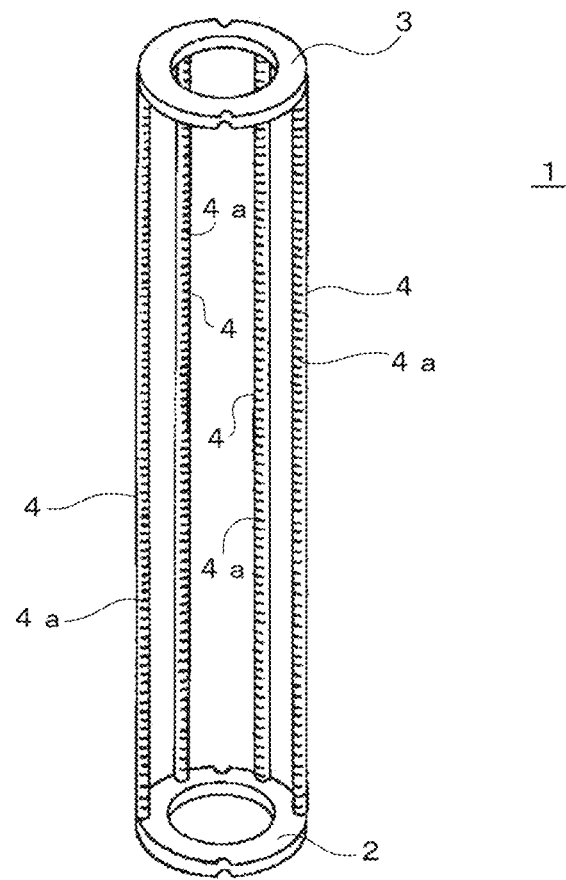
FIG. 6 is drawing illustrating the substrate holder of vertical type.

A vertical type wafer boat can be employed as a substrate holder, for example, as shown in FIG. 6. The wafer boat is approximately composed of a bottom plate 2, top plate 3, and four pillars 4, and is made of silicon (Si) or silicon carbide (SiC). A silicon oxide film 4a1 is formed on the surface thereof.

The bottom plate 2 is attached to the bottom portion of the pillar 4 and the top plate 3 is attached to the top portion of the pillars to be parallel to the bottom plate 21. A plurality of shelf portions 4a are formed along the vertical direction of the pillars 4 and silicon wafer substrates are mounted on the shelf portion 4a.

Figure 7:
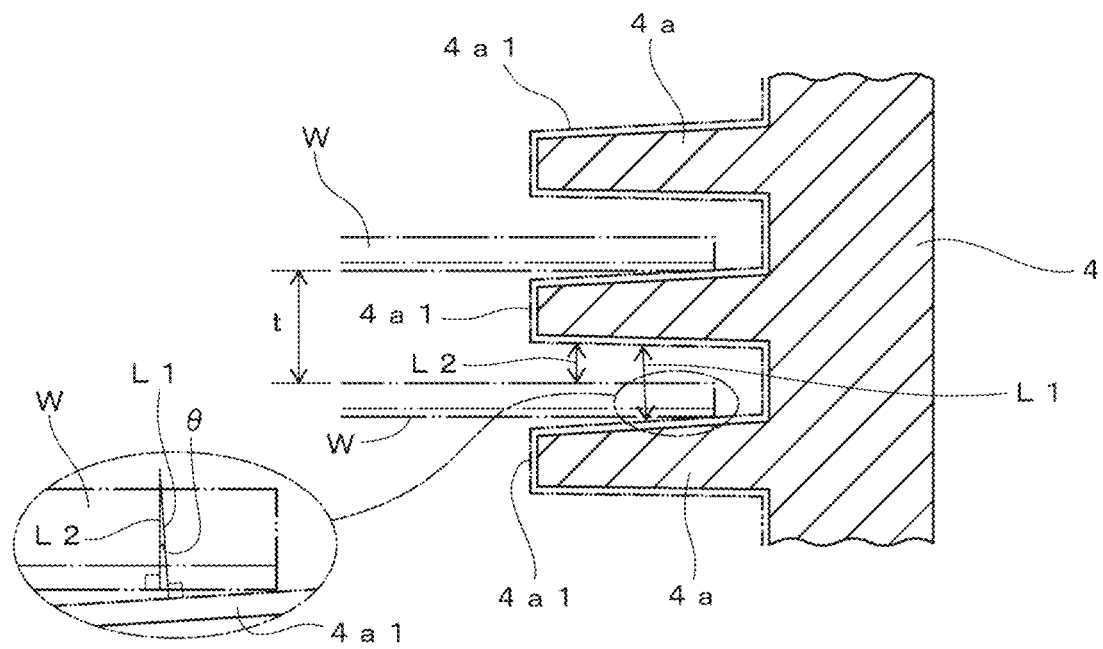
FIG. 7 is a partially enlarged view of the substrate holder shown in FIG. 6.

As shown in FIG. 7, the vertical type wafer boat 1 holds a plurality of wafers W. The spacing between wafers to be held ranges from 10 mm to 15 mm. The effects on the wafer surface of gas desorbing from the oxide film is not inhibited, with the spacing t between wafers W of less than 10 mm. If the spacing t between the wafers W exceeds 15 mm, the productivity decreases, which is undesirable.

As shown in FIG. 7, the angle between the perpendicular line L1 to the holding face of the shelf portion 4a to hold wafers and the perpendicular line L2 to the silicon wafer substrate surface is set to 0.5 degrees or more and 5.0 degrees or less.

The reason why the angle between the perpendicular line L1 to the holding face of the shelf portion 4a to hold wafers and the perpendicular line L2 to the silicon wafer substrate surface is set to 0.5 degrees or more and 5.0 degrees or less is that the range allows to reduce and minimize the contact area between the oxide film formed on the backside of the silicon wafer substrate and the substrate holder, the shelf portion 4a of the vertical type boat 1.

The maximum value is determined to be 5 degrees taking the typical tapered angle of the beveled portion of the semiconductor silicon wafer substrates into account.

The substrate holder is a vertical type wafer boat 1, for example, as shown in FIG. 7. A silicon oxide film 4a1 is formed on the surface of the substrate holder with a thickness X of 200 nm or more and 500 nm or less.

The silicon oxide film is formed on the substrate holder in advance such that the thickness X of the silicon oxide film on the substrate holder and the thickness Y of the silicon oxide film on the backside of the silicon wafer substrate satisfy a relational expression, $Y=C-X$, where C is a constant ranging from 800 to 1000.

The silicon oxide film on the surface of the substrate holder is formed using two source gases of oxygen and nitrogen at a temperature of 1000° C. or higher. The reason why the temperature of 1000° C. or higher is necessary is that the density of the silicon oxide film is almost constant at this temperature or higher. To maintain the strength of the material, the upper limit is preferably 1200° C.

Using nitrogen as a source gas causes the silicon oxide film to include silicon nitride $Si_3N_4$ and enhances the resistance of the silicon oxide film. The reason is to inhibit the decomposition of the silicon oxide film by the reaction by making the film formed to oxynitride.

Next, as shown in FIG. 2, the silicon wafer substrate is subjected to heat treatment to keep at a constant temperature of 700° C. or higher and 850° C. or lower for 30 minutes or longer or 120 minutes or shorter (Step S8).

The silicon oxide film densifies at a temperature of around 700° C. or higher, which causes impurities, moisture, and oxygen to desorb from the silicon oxide film. The surface of the silicon wafer substrate is apt to react at a temperature of 850° C. or higher, and with the existence of desorbed substances like above, the surface roughness of the wafer surface increases. The decomposition of aggregated phosphorus in Si—P defects and the diffusion are promoted at a temperature of 700° C. or higher to 850° C. or lower, but neither increases in Si—P defects nor density increase occur because of the low-temperature zone.

Accordingly, by setting the temperature of desorption reaction to the above temperature range, that is, to a constant temperature of 700° C. or higher and less than 850° C., impurities, moisture, and oxygen can be out-diffused from the silicon oxide film, and further, an increase in surface roughness of the wafers can be prevented.

Further, the keeping time at the above temperature range is 30 minutes or longer to 120 minutes or shorter. It is not preferable because the out-diffusion is not promoted when the keeping time is less than 30 minutes, and the productivity decreases when exceeding 120 minutes.

Further, the furnace atmosphere of the heat treatment is a mixed gas (processing gas) of hydrogen and argon. The reason why a diluted argon gas with hydrogen with a partial pressure of 50% to 80% is used is to accelerate annihilation of Si—P defects with hydrogen and also to prevent physical etching of the silicon oxide film by hydrogen $H_2$.

The flow speed at a position within 5 mm from the silicon wafer substrate of the process gas, which is composed of hydrogen $H_2$ and argon Ar, is set to be not less than 0.1 m/s and not more than 1 m/s.

The reason why the flow speed within a distance of 5 mm from the silicon wafer substrate of the process gas is set to 1 m/sec or less is to inhibit the desorption of gases from the oxide film on the backside of the silicon wafer substrate. In addition, repetitive reactions are suppressed because the density of SiO gas and other gases becomes higher.

It is not desirable that the gas flow in the furnace is not rectified and this becomes a cause of contamination when the flow speed of the process gas is less than 0.1 m/s, and it is not desirable that the etching of the oxide film on the backside of the silicon wafer substrate is promoted when the flow speed thereof is more than 1.0 m/s. The phrase "distant within 5 mm from the silicon wafer substrate" means that the distance from the backside of the silicon wafer substrate is within 5 mm, and the reason for setting the distance to within 5 mm is that the range of influence of the flow speed that determines the degree of the etching of the oxide film is taken into account.

Successively, after the temperature is raised, the silicon wafer substrate is kept at a constant temperature not less than 1100° C. and not more than 1250° C. for not less than 30 minutes and not more than 120 minutes (Step S9). The furnace atmosphere of the heat treatment is a mixed gas of hydrogen $H_2$ and argon Ar similar to Step S8 and the flow speed is maintained.

Thus, by keeping the silicon wafer substrate at a constant temperature of not less than 1100° C. and not more than 1250° C. for not less than 30 minutes and not more than 120 minutes, the relaxation of strains due to Si—P defects is achieved, and the relaxation of the strain due to Si—P defects allows inhibiting P-aggregation defects (Si—P defects).

It is not preferable because Si—P defects cannot be relaxed when kept at a temperature less than 1100° C. or at the above temperature range for less than 30 minutes, and because the silicon wafer substrates deform when kept at a temperature higher than 1250° C. or for 120 minutes or longer.

Further, after this, the temperature of the silicon wafer substrate is lowered such that the experience time of the wafers at a temperature of 700° C. or lower and 450° C. or higher is made less than 10 minutes (Step S10). Similar to Step S8, the furnace atmosphere of the heat treatment is a mixed gas of hydrogen $H_2$ and argon Ar, and the flow speed is maintained. Thus, reducing the experience time of the wafers at a temperature of 700° C. or lower and 450° C. or higher can inhibit P-aggregation defects (Si—P defects).

The furnace atmosphere, mixture of $H_2$ and Ar (process gas), in the above heat treatment process is desirably diluted argon gas with hydrogen partial pressure of 80% to 50% in the case of at a temperature of 700° C. or higher and less than 850° C., and diluted argon gas with the $H_2$ partial pressure is 0.01 to 20% for temperatures less than 700° C. and 850° C. or higher.

The reason why the furnace atmosphere is a diluted argon gas with hydrogen partial pressure of 80% to 50% at a temperature of 700° C. or higher and less than 850° C. is that the densification of the oxide film is promoted because the impurities such as moisture in the oxide film are reduced in the atmosphere of diluted argon gas with the hydrogen partial pressure of 80% to 50% at a temperature less than 850° C.

Further, the reason why the furnace atmosphere is a diluted argon gas with a hydrogen partial pressure of 0.01% to 20% at temperatures of less than 700° C. and 850° C. or higher is to suppress the reduction by hydrogen $H_2$ of the oxide film ($SiO_2$).

Figure 3:
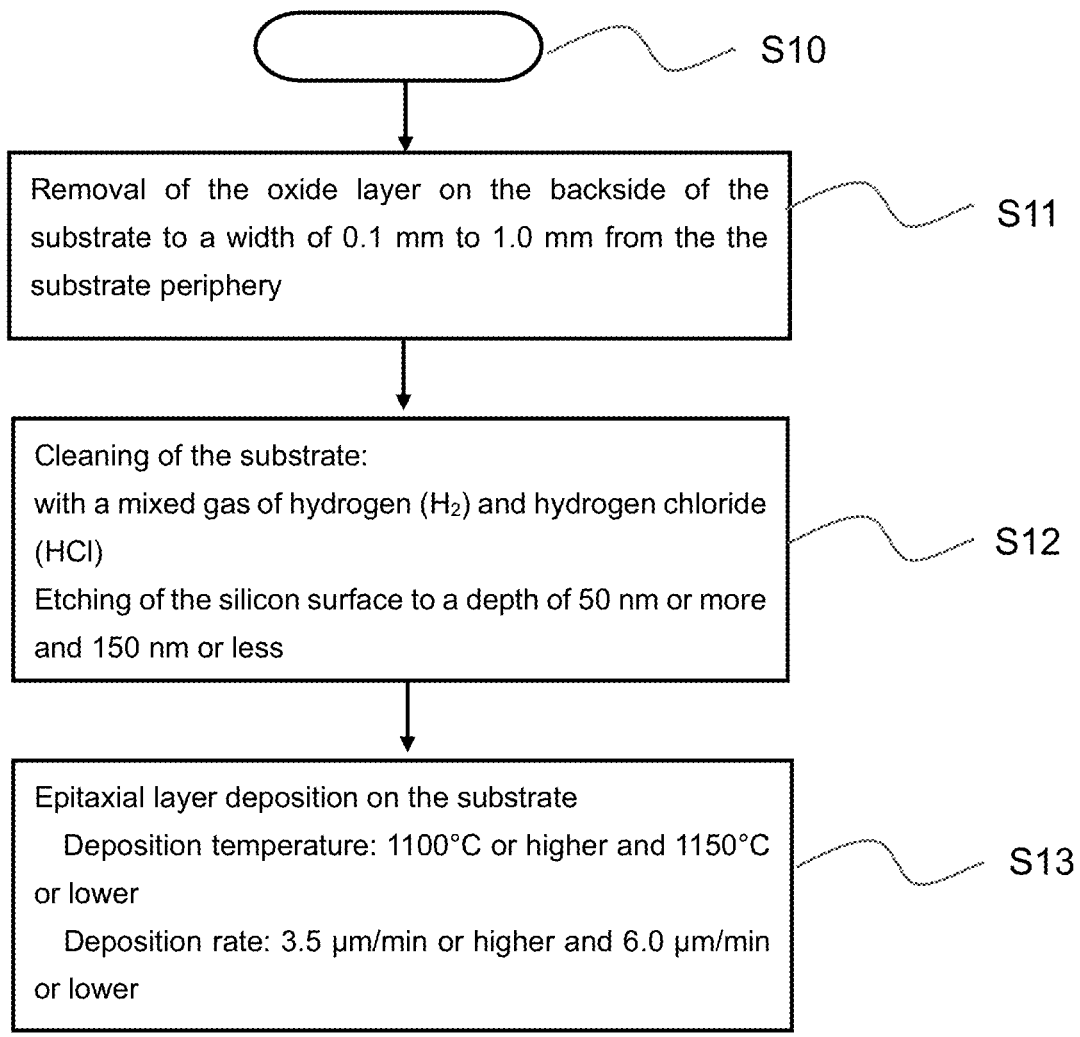
FIG. 3 is the continuation of the flowchart in FIG. 2 of the embodiment of the manufacturing method for silicon wafers according to the present invention.

As shown in FIG. 3, after the heat treatment above, the silicon oxide film on the backside of the silicon wafer substrate is removed by outer-periphery machining to a distance of 0.1 mm to 1.0 mm from the silicon wafer substrate periphery (Step S11). This aims to suppress the peeling of the silicon oxide film on the backside of the silicon wafer substrate in the processing thereafter by removing the peripheral portion of the oxide film partially etched by the heat treatment. The distance is set to 0.1 mm to 1.0 mm from the periphery of the wafer, which is the degree that does not affect auto-doping.

As described above, the reason why the silicon oxide film on the backside of the silicon wafer substrate is removed by machining up to a certain distance within a range of 0.1 mm to 1.0 mm from the silicon wafer substrate periphery is that this area is the position from where phosphorus out-diffuses during the long-time heat treatment thereafter, and as a result, the out-diffusion of phosphorus from the above position is suppressed in the epitaxial layer growth process, which is a countermeasure for auto-doping. It is to be noted that the removed area is small, and the amount of in-diffusion into the wafer after the long-time heat treatment is negligible.

Further, the removed distance of the silicon oxide film less than 0.1 mm from the periphery has no effect described above, whereas it is not desirable because the removed distance of the silicon oxide film more than 1.0 mm from the periphery causes mechanical damages by the substrate holder to increase during the long-time heat treatment or epitaxial layer growth process due to the increase of the area without oxide film.

Next, as shown in FIG. 3, the silicon wafer substrate before epitaxial layer growth is subjected to surface cleaning (Step S12).

In the surface cleaning step, the silicon surface is removed by etching by 50 nm or more to 150 nm or less with a mixed gas of hydrogen ($H_2$) and hydrogen chloride (HCl).

The surface cleaning of the silicon wafer substrate in this manner can further reduce SF after epitaxial layer growth. In this case, defect removal by hydrogen chloride HCl is effective, and defect removal by mixed gas of hydrogen $H_2$ and hydrogen chloride HCl is further desirable.

However, the remaining depth of defects is approximately 100 nm or less, and the etching of surface silicon to a depth of 50 nm or more to 150 nm or less is appropriate when productivity is taken into account.

Then, a silicon epitaxial layer is deposited at a temperature of 1100° C. or higher and 1150° C. or lower at a deposition rate of 3.5 μm/min or faster and 6.0 μm/min or slower (Step S13).

Through the intensive studies, it is found that there is an appropriate combination of growth rate and temperature of the silicon monocrystalline epitaxial layer for the reduction of SF.

Figure 8:
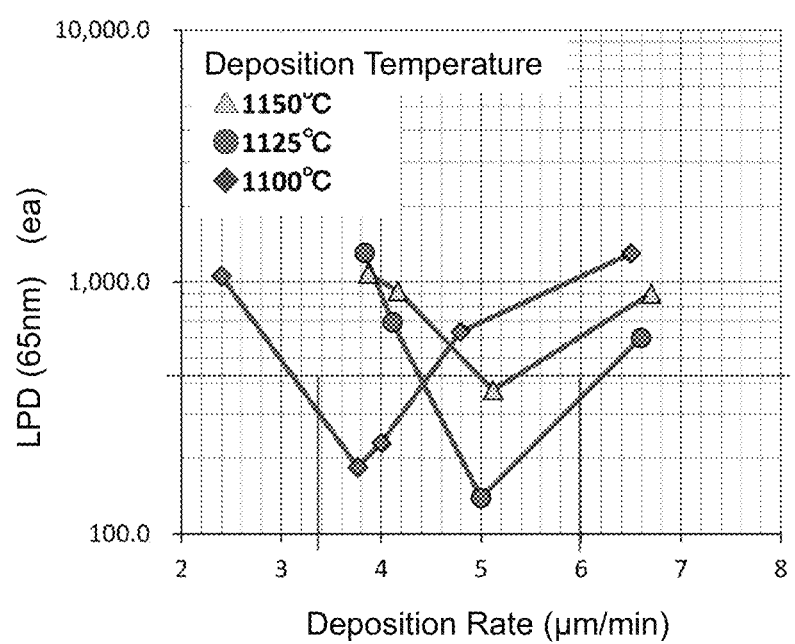
FIG. 8 shows the dependence of the number of LPDs on growth temperature of silicon film and growth rate.

As shown in FIG. 8, it is found that deposition of the silicon film at a temperature to 1100° C. or higher and 1150° C. or lower at a deposition rate of 3.5 μm/min or faster and 6.0 μm/min or slower can suppress the generation of LPD.

It is not desirable because the control of electrical properties in device operation is difficult in the silicon monocrystalline epitaxial layer deposited with a thickness of fewer than 1.3 μm, and the film with a thickness of more than 10.0 μm increases the cost of epitaxial wafers.

A silicon film is grown through the movement of silicon atoms on the steps on the silicon surface. With this process, the formation of SF is inhibited because the movement of silicon atoms relaxes disorders of the arrangement of silicon atoms originating from Si—P defects.

To achieve both Si film deposition and this relaxation, a condition that the Si film deposition temperature is 1100° C. or higher and 1150° C. or lower, and the deposition rate is 3.5 μm/min or higher and 6.0 μm/min or lower is required.

Embodiments

The present invention will be further specifically described based on examples and comparative examples, but the present invention is not limited to those examples.

Experiment 1

Changes in the size of Si—P defects occurring in the silicon wafer substrate and the density thereof due to the changes in the pulling-up speed of silicon single crystal, the changes in the magnetic field strength, and the presence of forcible cooling by water cooler were verified.

Silicon single crystal doped with phosphorus (P) and having resistivity adjusted to 0.05 mΩ·cm was pulled up such that the solid-solution oxygen concentration was $0.9 \times 10^{18}$ atoms/cm$^3$ or less.

Figure 10:
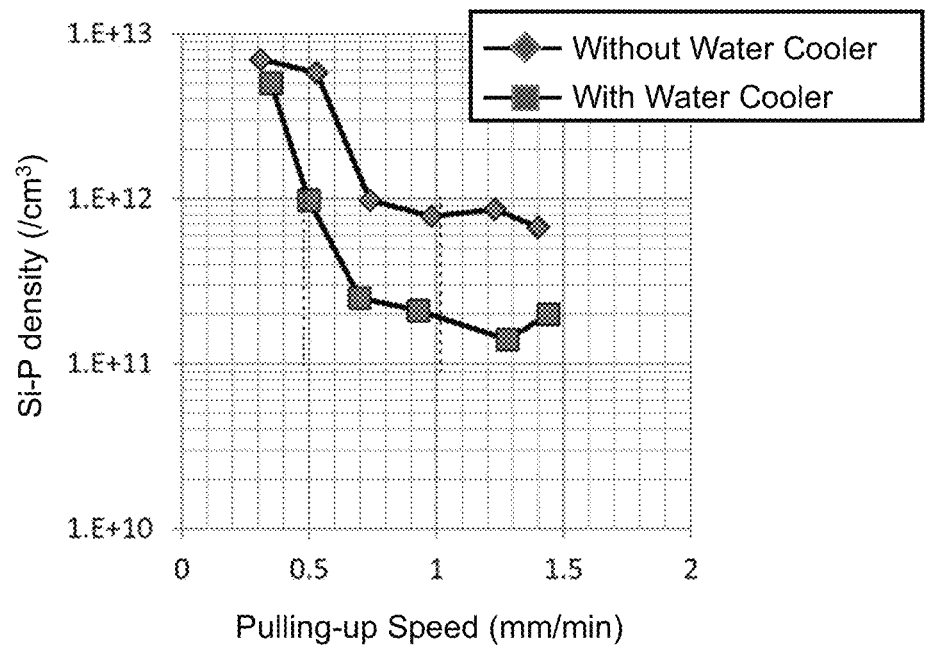
FIG. 10 is a graph showing the results of Experiment 1.

In this process, the pulling-up speed was varied to values between 0.3 mm/min and 1.4 mm/min. The applied magnetic field was 3000 G. Both the maximum side length and the density of the Si—P defects were investigated in cases with or without a water cooler in the pulling-up furnace. The results are shown in FIG. 10.

The size of Si—P defects was measured with the transmission electron microscope. The density of the Si—P defects was calculated from the observed region obtained by defect observation with the transmission electron microscope.

The results showed that the maximum side length of Si—P defects is less than 100 nm with or without the installation of the water cooler.

In the case without the installation of the water cooler, the density shows the tendency of decreasing with the increase of the pulling-up speed; that is, the density becomes $1 \times 10^{12}$/cm$^3$ or lower at the pulling-up speed of approximately 0.7 mm/min or more.

In contrast, in the case with the installation of the water cooler, the density becomes $1 \times 10^{12}$/cm$^3$ or lower at the pulling-up speed of approximately 0.5 mm/min or more. Even if the pulling-up speed is increased more than 1 mm/min, the density tends to decrease with the increase in the pulling-up speed. Because the effect of increasing the pulling-up speed is small and this will also reduce productivity, a pulling-up speed is preferably 1 mm/min or lower.

Experiment 2

In Experiment 2, it was verified that the accumulated slip length is less than 10 mm when the silicon oxide film thicknesses X and Y fall in a range described by the relational expression: Y=C–X, where C is a constant between 800 and 1000, as shown as Step 7 in FIG. 2.

The dopant is red phosphorus, the pulling-up speed was 0.7 mm/min, and the magnetic field strength was 3000 G. Then, silicon wafer substrates having a resistivity of 0.80 mΩ·cm, an oxygen concentration of $0.8 \times 10^{18}$ atoms/cm$^3$, and a slicing angle of 0.3 degrees were obtained.

Further, an oxide film on the backside was formed to a thickness of 500 nm at a temperature of 430° C., and the front surface of the silicon wafer substrate was mirror-polished under the mechanical and chemical conditions of using a polishing cloth and slurry containing colloidal silica.

The thickness of the oxide film (LTO) on the backside of the silicon wafer substrate was changed by varying the heat treatment time, and the thickness of the thermal oxide film formed on the silicon boat for silicon wafer substrate processing was changed.

With those changes combined, after silicon wafer substrates were heat-treated at a temperature of 1200° C. for 60 minutes, the accumulated slip length of each silicon wafer substrate was measured by x-ray topography.

Figure 11:
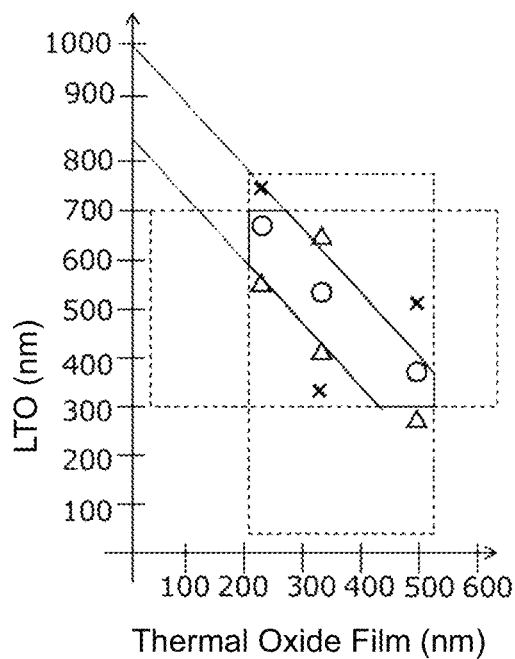
FIG. 11 is a graph showing the results of Experiment 2.

The graph in FIG. 11 shows the measurement results. In FIG. 11, the open circle (○) denotes the accumulated slip length is less than 10 mm, the triangle (Δ) denotes the accumulated slip length ranges from 10 mm to 50 mm, and the cross (x) denotes the accumulated slip length exceeds 50 mm.

In case the thickness of the thermal oxide film formed on the silicon boat ranges from 200 nm to 500 nm and the thickness X of the thermal oxide film and the thickness Y of the silicon oxide film (LTO) on the backside of the silicon wafer substrate lie in the area represented by the relational expression Y=C–X, where C is a constant ranging from 800 to 1000, then the accumulated slip length becomes less than 10 mm; favorable results can be obtained.

Experiment 3

In Experiment 3, a verification experiment was conducted on reduction of an increase in wafer surface roughness by keeping the silicon wafer substrate at a constant temperature of 700° C. or higher and less than 850° C. for 30 minutes or longer and 120 minutes or shorter, the inhibition of generation of wafer surface pits (LPD) due to the above heat treatment, and acceleration of annihilation of Si—P defects, which is shown as Step S8 in FIG. 2.

A silicon oxide film is formed on the backside of the silicon wafer substrate which has a resistivity of 1.05 mΩ·cm or less, an oxygen concentration of $0.9 \times 10^{18}$ atoms/cm$^3$, and Si—P defects whose maximum side length is less than 100 nm and whose density is less than $1 \times 10^{12}$/cm$^3$. The oxide film was deposited at a temperature in a range from 400° C. to 450° C. to a thickness of 500 nm.

Successively, the front surface of the silicon wafer substrate was mirror-polished; the removed thickness by the polishing was 15 μm. The surface-polished silicon wafer substrate was subjected to heat treatment in a vertical type diffusion furnace at 1200° C. for 60 minutes. The furnace atmosphere of the heat treatment was a mixed gas of hydrogen and argon, a diluted argon gas with a hydrogen partial pressure of 1%.

At the time of raising temperature before the heat treatment at 1200° C. and for 60 minutes, the silicon wafer substrate was heat-treated at 650° C., 700° C., 800° C., 850° C., and 900° C. and kept for 15 minutes, 30 minutes, 120 minutes, and 180 minutes at each temperature.

The furnace atmosphere of the heat treatment was a mixed gas of hydrogen and argon, a diluted argon gas with a hydrogen partial pressure of 60%, and the flow speed of the process gas was 0.7 m/s distant within 5 mm from the silicon wafer substrate.

A silicon monocrystalline epitaxial layer was deposited to a thickness of 4 μm at a growth rate of 4.0 μm/min at 1150° C. The removal amount of the silicon surface layer before the epitaxial growth was 100 nm with a partial pressure of hydrogen chloride of 0.5%.

Figure 12:
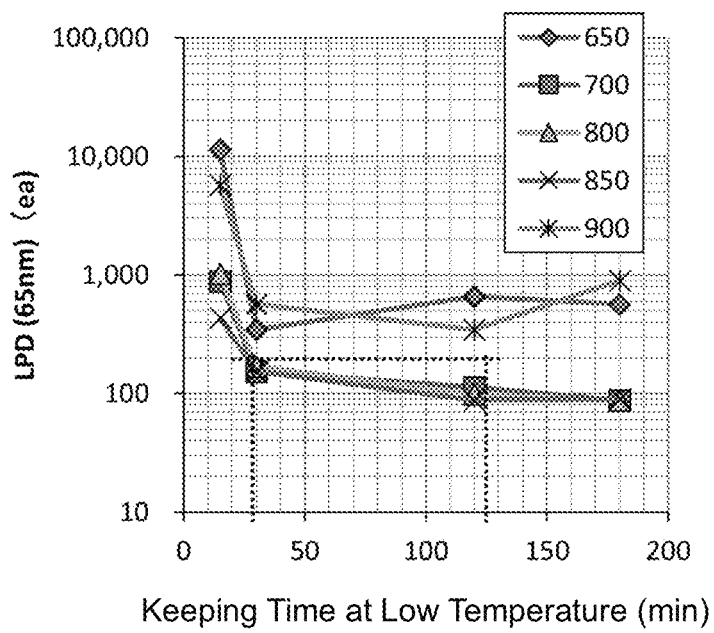
FIG. 12 is a graph showing the results of Experiment 3.

The verification method is to measure the number of LPDs using SurfScan SP1 manufactured by KLA-Tencor Corporation. FIG. 12 shows the measurement results. As shown in FIG. 12, the number of LPDs reaches an approximately constant value with a keeping time of 30 minutes. It is confirmed that the keeping time is preferably 30 minutes to 120 minutes considering productivity.

The deterioration of the LPD number when held at 650° C. or 900° C. is because being held under such temperatures, impurities, moisture, and oxygen desorb from the oxide film on the backside of the wafer, which thus causes the roughness to increase and to generate pits, and these remain as LPDs after the epitaxial growth. The heat treatment temperature of the silicon wafer substrate is preferred to be from 700° C. to 850° C.

Experiment 4

At the time of raising temperature before the heat treatment at 1200° C. for 60 minutes, the silicon wafer substrate was kept at 800° C. for 120 minutes and the flow speed of the process gas is varied 0.05 m/s, 0.1 m/s, 0.5 m/s, 1.0 m/s and 1.5 m/s.

As the results of the visual inspection of the appearance of wafers, clearly recognizable clouding on the front side of the wafers for the flow speed of 0.05 m/s and pinholes on the backside of the wafers due to etching for the flow speed of 1.5 m/s are observed in respective cases, but any of them are not observed for the flow speed of 0.1 m/s, 0.5 m/s, and 1.0 m/s.

Experiment 5

In Experiment 5, verification experiments were conducted to confirm that the strain of Si—P defects can be relaxed by keeping the silicon wafer substrate at a constant temperature of 1100° C. or higher and 1250° C. or lower for 30 minutes or longer and 120 minutes or shorter, which is Step 9 shown in FIG. 2.

First, a silicon oxide film was formed on the backside of a silicon wafer substrate having a resistivity of 1.05 mΩ·cm or less, the solid-solution oxygen concentration of $0.9\times10^{18}$ atoms/cm$^3$ or less, Si—P defects with the maximum side length of less than 100 nm, and the density thereof is less than $1\times10^{12}$/cm$^3$. The oxide film was grown to a thickness of 500 nm at a temperature ranging from 400° C. to 450° C.

Successively, the front side surface of the silicon wafer substrate was mirror-polished, and the removed amount by the mirror-polishing was 15 μm.

Then, heat treatment was carried out to the silicon wafer substrate subjected to mirror-polishing in a vertical-type diffusion furnace at temperatures of 1050° C., 1100° C., 1200° C., 1250° C., and 1270° C. for 15 minutes, 30 minutes, 120 minutes, and 180 minutes at each temperature. At the time of raising temperature before the heat treatment at 1200° C. for 60 minutes, the silicon wafer substrate was heat-treated to keep at 800° C. for 120 minutes. The atmosphere in the furnace at this processing was a mixed gas of hydrogen and argon with a hydrogen partial pressure of 1%.

The silicon surface layer of the silicon wafer substrate was removed by 100 nm with hydrogen chloride (HCl) before forming a silicon monocrystalline epitaxial layer. The partial pressure of hydrogen chloride was 0.5% and the temperature was 1180° C.

Then, a silicon monocrystalline epitaxial layer was deposited to a thickness of 4.0 μm at a growth rate of 4.0 μm/min at 1150° C.

Figure 13:
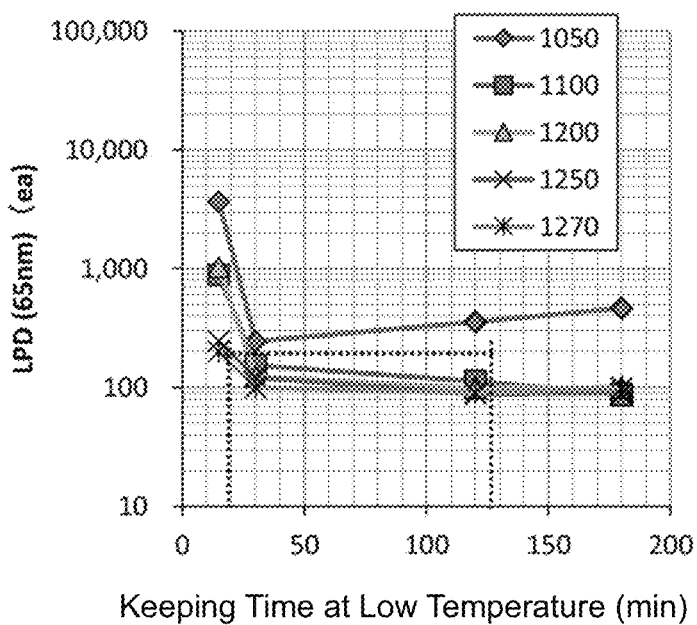
FIG. 13 is a graph showing the results of Experiment 5.

The verification method is to measure the number of LPDs using SurfScan SP1 manufactured by KLA-Tencor Corporation. FIG. 13 shows the measurement results. As shown in FIG. 13, the number of LPDs reaches an approximately constant value with a keeping time of 30 minutes. It is confirmed that the keeping time is preferably 30 minutes to 120 minutes considering productivity. As shown in FIG. 13, the number of LPD decreases as the temperature rises. The temperature is preferably from 1100° C. to 1250° C. considering the problems of slip and productivity.

Experiment 6

In Experiment 6, verification experiments were conducted to confirm that by lowering the temperature from less than 700° to 450° C. to make the experience time less than 10 minutes, and by shortening the transit time at temperatures from 450° C. or higher to less than 700° C., P-aggregated defects (Si—P defects) can be inhibited, which is Step 10 shown in FIG. 2.

First, a silicon oxide film was formed on the backside of a silicon wafer substrate having a resistivity of 1.05 mΩ·cm or less, a concentration of solid-solution oxygen of $0.9\times10^{18}$ atoms/cm$^3$ or less, Si—P defects with a maximum side length of less than 100 nm, and its density of less than $1\times10^{12}$/cm$^3$. The oxide film was grown to a thickness of 500 nm at a temperature ranging from 400° C. to 450° C.

Successively, the front-side surface of the silicon wafer substrate was mirror-polished, and the removed amount by the mirror-polishing was 15 μm.

The surface-polished silicon wafer substrate was subjected to heat treatment at 1200° C. for 60 minutes. The furnace atmosphere of the heat treatment was a mixed gas of hydrogen and argon, a diluted argon gas with a hydrogen partial pressure of 1%.

At the time of raising temperature before the heat treatment at 1200° C. for 60 minutes, the silicon wafer substrate was heat-treated to keep at 800° C. for 120 minutes. The furnace atmosphere of the heat treatment was a mixed gas of hydrogen and argon, a diluted argon gas with a hydrogen partial pressure of 60%.

The taking-out temperature after the above-described heat treatment was set to 700° C., and the taking-out speed from the furnace from then on was varied. The temperature of the silicon wafers exposed to the atmosphere was measured by thermography, and the experience time was calculated by adding the taking-out time to the keeping time at 700° C.

With this, the experience time of the wafers at less than 700° C. to 450° C. or higher was varied as 3 minutes, 5 minutes, 8 minutes, 10 minutes, 12 minutes, 15 minutes, and 20 minutes.

In addition, the surface layer of the silicon wafer substrates was removed 100 nm by hydrogen chloride before the deposition of a silicon monocrystalline epitaxial layer. At this time the partial pressure of hydrogen chloride was 0.5% and the temperature was set to 1180° C.

Figure 14:
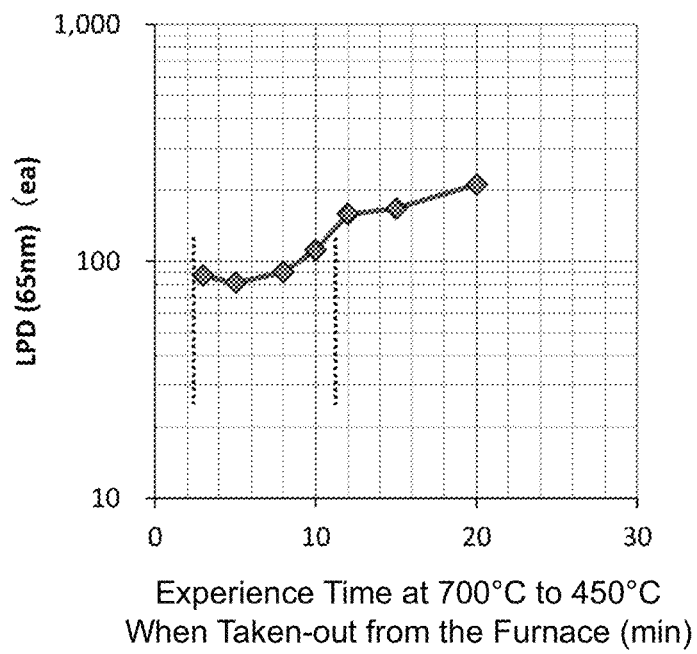
FIG. 14 is a graph showing the results of Experiment 6.

Then, a silicon monocrystalline epitaxial layer was formed to a thickness of 4 μm on the silicon wafer substrate at a deposition rate of 4 μm/min at 1150° C. FIG. 14 shows the results. As shown in FIG. 14, it is confirmed that by lowering the temperature to make the experience time of the wafer less than 10 minutes at the temperature between less than 700° C. and 450° C. or higher, the number of LPD was 100 or fewer and the P-aggregation defects (Si—P defects) was able to be inhibited.

Experiment 7

In experiment 7, the effect of removing the Si oxide film on the back surface of the silicon wafer substrate by outer peripheral machining to a distance of 0.1 to 1.0 mm from the outer periphery of the silicon wafer substrate was verified.

First, a silicon oxide film was formed on the backside of a silicon wafer substrate having a resistivity of 1.05 mΩ·cm or less, the solid-solution oxygen concentration of $0.9 \times 10^{18}$ atoms/cm$^3$ or less, Si—P defects with the maximum side length of less than 100 nm, and its density of less than $1 \times 10^{12}$/cm$^3$. The oxide film was grown to a thickness of 500 nm at a temperature ranging from 400° C. to 450° C.

Successively, the front-side surface of the silicon wafer substrate was mirror-polished, and the removed amount by the mirror-polishing was 15 μm.

The surface-polished silicon wafer substrate was subjected to heat treatment at 1200° C. for 60 minutes. The furnace atmosphere of the heat treatment was a mixed gas of hydrogen and argon, a diluted argon gas with a hydrogen partial pressure of 1%.

At the time of raising temperature before the heat treatment at 1200° C. for 60 minutes, the silicon wafer substrate was heat-treated to keep at 800° C. for 120 minutes. The atmosphere in the furnace for this processing was a mixed gas of hydrogen and argon, a diluted argon gas with a hydrogen partial pressure of 60%.

After the above heat treatment, the taking-out temperature from the furnace was 700° C., and the taking-out speed was varied. The temperature of the silicon wafers exposed to the atmosphere was measured by thermography, and the experience time was calculated by adding the taking-out time to the keeping time at 700° C.

With this, the experience time of the wafers at less than 700° C. to 450° C. or higher was to be 8 minutes.

The removal distance range of the silicon oxide film on the backside of the silicon wafer substrate was varied to a distance from the silicon wafer substrate periphery of 0.1 mm, 0.2 mm, 0.5 mm, 1.0 mm, and 1.5 mm.

The surface layer of this silicon wafer substrate was removed 100 nm by hydrogen chloride before the deposition of a silicon monocrystalline epitaxial layer, and in this processing, the partial pressure of hydrogen chloride was 0.5%, and the temperature was 1180° C.

Then, a silicon monocrystalline epitaxial layer was deposited to a thickness of 4.0 μm at a growth rate of 4.0 μm/min at 1150° C.

Figure 15:
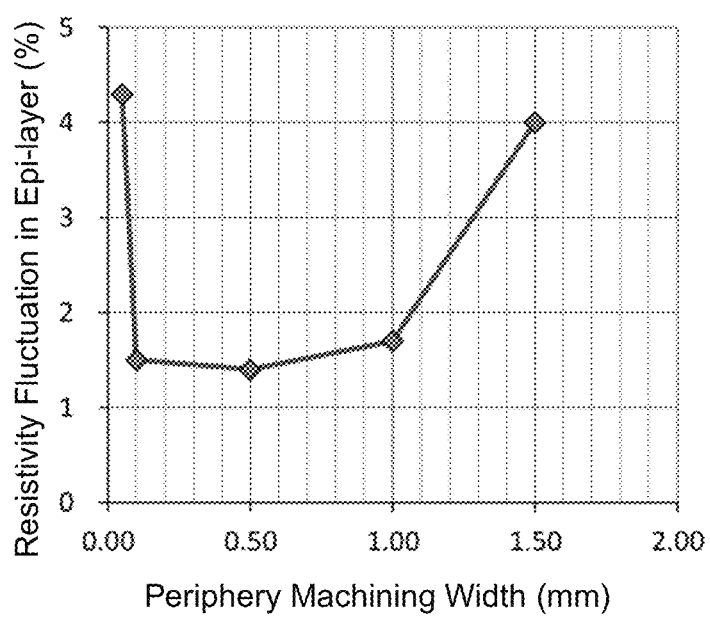
FIG. 15 is a graph showing the results of Experiment 7.

As shown in FIG. 15, for the case when the machined width at the circumferential periphery is less than 0.1 mm, the out-diffusion of phosphorus from the covered portion is not sufficient at the time of long-time heat treatment. Accordingly, because the oxide film of the covered area is etched when epitaxial growth, the out-diffusion of phosphorus from the etched area causes the variation in resistivity to deteriorate. For the case when the machined width at the circumferential periphery is 1 mm or more, the area of the uncovered portion is large and the out-diffusion of phosphorus is not sufficient at the time of long heat treatment. As a result, the out-diffusion of phosphorus from the uncovered portion deteriorates the variation in resistivity when epitaxial growth. Thus, the preferred machined width is in a range from 0.1 mm to 1.0 mm.

Experiment 8

In Experiment 8, the silicon removal amount of the silicon wafer substrate surface and the SF (LPD) due to Si—P defects were verified, which is shown in Step S12 in FIG. 3. The verification method is to measure the number of LPDs using SurfScan SP1 manufactured by KLA-Tencor Corporation.

First, a silicon oxide film was formed on the backside of a silicon wafer substrate having a resistivity of 1.05 mΩ·cm or less, the solid-solution oxygen concentration of $0.9 \times 10^{18}$ atoms/cm$^3$ or less, Si—P defects with the maximum side length of less than 100 nm, and the density thereof is less than $1 \times 10^{12}$/cm$^3$. The oxide film was grown to a thickness of 500 nm at a temperature ranging from 400° C. to 450° C.

Successively, the front-side surface of the silicon wafer substrate was mirror-polished, and the removed amount by the mirror-polishing was 15 μm. The surface-polished silicon wafer substrate was subjected to heat treatment at 800° C. for 120 minutes and 1200° C. for 60 minutes in a vertical type diffusion furnace.

The experience time of the wafers at less than 700° C. to 450° C. or higher was 8 minutes. The furnace atmosphere of the heat treatment was a mixed gas of hydrogen and argon, a diluted argon gas with a hydrogen partial pressure of 60%.

Then, a silicon monocrystalline epitaxial layer was deposited to a thickness of 4 μm at a growth rate of 4.0 μm/min at 1150° C. The removal amount of the silicon surface layer before the epitaxial growth with hydrogen chloride was varied to 500 nm at maximum at a partial pressure of hydrogen chloride of 0.5%. Then, the number of LPDs (65 nm) on the silicon wafer substrate was measured.

Figure 16:
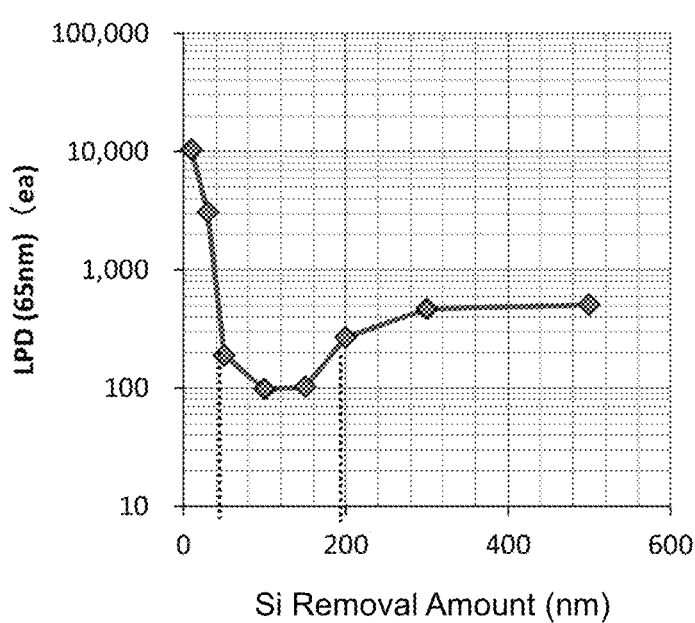
FIG. 16 is a graph showing the results of Experiment 8.

FIG. 16 shows the results. In FIG. 16, "ea" of the vertical axis denotes the number of LPDs. The term LPD (65 nm) means the measurement of LPDs existing on the principal surface having scattering intensity equivalent to that of a particle of 65 nm or larger in standard particle size.

As understood from FIG. 16, the number of LPD (65 nm) is 10,000 when the silicon removal of the silicon wafer substrate surface is not performed, whereas the number of LPD (65 nm) is 100 to 200 when the silicon removal of the surface of the silicon wafer substrate is 50 nm to 200 nm. The preferred removal amount of silicon is 50 nm or more and 150 nm or less, considering productivity.

Experiment 9

Verification experiments were conducted to confirm whether P-aggregate defects (P—Si defects) are inhibited by depositing an epitaxial layer to a thickness of 1.3 µm or more and 10.0 µm or less at a deposition rate of 3.5 µm/min or higher and 6.0 µm/min or lower at a deposition temperature of 1100° C. or higher and 1150° C. or lower.

First, a silicon oxide film was formed on the backside of a silicon wafer substrate having a resistivity of 1.05 mΩ·cm or less, a concentration of the solid-solution oxygen of $0.9 \times 10^{18}$ atoms/cm³ or less, Si—P defects with a maximum side length of less than 100 nm, and its density of less than $1 \times 10^{12}$/cm³. The oxide film was formed to a thickness of 500 nm at a temperature ranging from 400° C. to 450° C.

Successively, the front-side surface of the silicon wafer substrate was mirror-polished, and the removed amount by the mirror-polishing was 15 µm. The surface-polished silicon wafer substrate was subjected to heat treatment in a vertical type diffusion furnace at 1200° C. for 60 minutes. The furnace atmosphere of the heat treatment was a mixed gas of hydrogen and argon, a diluted argon gas with a hydrogen partial pressure of 1%.

At the time of the raising temperature before the heat treatment at 1200° C. for 60 minutes, the silicon wafer substrate was heat-treated to keep at 800° C. for 120 minutes. The furnace atmosphere of the heat treatment was a mixed gas of hydrogen and argon, a diluted argon gas with a hydrogen partial pressure of 60%.

The experience time of the wafers at less than 700° C. to 450° C. or higher was to be 8 minutes.

Then the silicon surface layer of the silicon wafer substrate was removed 100 nm with hydrogen chloride (HCl) before forming a silicon monocrystalline epitaxial layer. The partial pressure of hydrogen chloride was 0.5% and the temperature 1180° C.

Then, a silicon monocrystalline epitaxial layer was deposited to a thickness of 4.0 µm with varying the growth rate of 2.4 µm/min, 3.8 µm/min, 4.0 µm/min, 5.0 µm/min, and 6.4 µm/min at temperatures of 1100° C., 1125° C., and 1150° C.

Then, the number of LPDs was measured using SurfScan SP1 manufactured by KLA-Tencor Corporation. FIG. 8 shows the results.

As shown in FIG. 8, LPDs can be inhibited by setting the deposition temperature to be at 1100° C. or higher and 1150° C. or lower and the deposition rate to be at 3.5 µm/min or higher and 6.0 µm/min or lower. The deposition temperature of the silicon film is preferably 1100° C. or higher and 1150° C. or lower because problems such as slip in the silicon wafer substrate reveal at a deposition temperature of 1200° C.

What is claimed is:

1. A method for manufacturing a semiconductor silicon wafer composed of a silicon wafer substrate and a silicon monocrystalline epitaxial layer thereon, comprising:
   step of forming a silicon oxide film with a thickness of 300 nm or thicker and 700 nm or thinner on the backside of the silicon wafer substrate, the silicon wafer substrate being manufactured from a silicon ingot grown by the Czochralski method, being doped with phosphorus, having resistivity being adjusted to be 1.05 mΩ·cm or less, and containing defects being essentially Si—P crystal defects formed by the aggregation of phosphorus in the crystal;
   a step of mirror-polishing a silicon wafer substrate;
   a step of heat treatment to keep the silicon wafer substrate mounted on a substrate holder at a constant temperature of 700° C. or higher and 850° C. or lower for 30 minutes or longer and 120 minutes or shorter at a processing gas flow speed of 0.1 m/s or higher and 1.0 m/s or lower at a distance within 5 mm from the silicon wafer substrate, and then after raising the temperature, at a constant temperature of 1100° C. or higher and 1250° C. or lower for 30 minutes or longer and 120 minutes or shorter with the flow speed of processing gas maintained, the substrate holder which is made of silicon (Si) or silicon carbide (SiC), has a silicon oxide film on the surface with a thickness of 200 nm or more and 500 nm or less and satisfies a relational equation Y=C−X,
   where X denotes the thickness of the silicon oxide film of the substrate holder and Y denotes the thickness of the silicon oxide film formed on the backside of the silicon wafer substrate, and C denotes a constant with a value from 800 to 1000;
   a step of removing the silicon oxide film on the backside of the silicon wafer substrate by periphery machining to a distance of 0.1 mm to 1.0 mm from the circumferential periphery of the silicon wafer substrate after the heat treatment; and
   a step of depositing a silicon monocrystalline epitaxial layer to a thickness of 1.3 µm or more and 10.0 µm or less.

2. The method for manufacturing a semiconductor silicon wafer according to claim 1, wherein the substrate holder has a holding surface to hold the silicon wafer substrate, and the angle between the normal of the holding surface and the normal of the surface of the silicon wafer substrate is set to 0.5 degrees or more and 5.0 degrees or less.

3. The method for manufacturing a semiconductor silicon wafer according to claim 1, wherein the substrate holder holds a plurality of silicon wafer substrates, and the spacing between the silicon wafer substrates held is set to 10 mm or wider and 15 mm or narrower.

4. The method for manufacturing a semiconductor silicon wafer according to claim 1, wherein
   the silicon oxide film on the surface of the silicon wafer substrate holder is deposited using two types of source gases of oxygen and nitrogen at a temperature of 1000° C. or higher.

5. The method for manufacturing a semiconductor silicon wafer according to claim 1, wherein
   processing gas in the heat treatment step is a diluted argon gas with the hydrogen ($H_2$) partial pressure of 50% to 80% at a temperature of 700° C. or higher and less than 850° C. and is a diluted gas with the hydrogen ($H_2$) partial pressure of 0.01% to 20% at a temperature of less than 700° C. and 850° C. or higher.

6. The method for manufacturing a semiconductor silicon wafer according to claim 1, further comprising a step of surface cleaning of the silicon wafer substrate before the deposition of an epitaxial layer, in the surface cleaning step, the surface silicon of the silicon wafer substrate is etched to a depth of 50 nm or more to 150 nm or less with a mixture gas of hydrogen ($H_2$) and hydrogen chloride (HCl).

7. The method for manufacturing a semiconductor silicon wafer according to claim 1, wherein in the step of forming a silicon monocrystalline epitaxial layer, the epitaxial layer is deposited at a deposition temperature of 1100° C. or higher and 1150° C. or lower at a deposition rate of 3.5 µm/min or higher and 6.0 µm/min or lower.

* * * * *